United States Patent
Ishii et al.

(10) Patent No.: US 10,468,460 B2
(45) Date of Patent: Nov. 5, 2019

(54) IMAGE SENSORS

(71) Applicant: Samsung Electronics Co., Ltd., Suwon-si, Gyeonggi-do (KR)

(72) Inventors: Masaru Ishii, Hwaseong-si (KR); GwideokRyan Lee, Suwon-si (KR); Taeyon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 75 days.

(21) Appl. No.: 15/787,846

(22) Filed: Oct. 19, 2017

(65) Prior Publication Data

US 2018/0301509 A1    Oct. 18, 2018

(30) Foreign Application Priority Data

Apr. 12, 2017    (KR) .................. 10-2017-0047540

(51) Int. Cl.

| | |
|---|---|
| *H01L 27/146* | (2006.01) |
| *H01L 27/30* | (2006.01) |
| *H04N 5/374* | (2011.01) |
| *H04N 5/378* | (2011.01) |
| *H04N 5/359* | (2011.01) |
| *H04N 5/3745* | (2011.01) |

(52) U.S. Cl.
CPC ...... *H01L 27/307* (2013.01); *H01L 27/14621* (2013.01); *H01L 27/14627* (2013.01); *H01L 27/14636* (2013.01); *H01L 27/14645* (2013.01); *H04N 5/3591* (2013.01); *H04N 5/3597* (2013.01); *H04N 5/374* (2013.01); *H04N 5/378* (2013.01); *H04N 5/3745* (2013.01); *H04N 5/37457* (2013.01)

(58) Field of Classification Search
CPC ................................................ H01L 27/14636
See application file for complete search history.

(56) References Cited

U.S. PATENT DOCUMENTS

| | | | |
|---|---|---|---|
| 8,988,571 | B2 | 3/2015 | Sugawa et al. |
| 9,165,964 | B2 | 10/2015 | Fukuda |
| 9,197,830 | B2 | 11/2015 | Mori et al. |

(Continued)

FOREIGN PATENT DOCUMENTS

| | | |
|---|---|---|
| JP | 4931160 B2 | 5/2012 |
| JP | 2013/089707 A | 5/2013 |

(Continued)

*Primary Examiner* — Thomas L Dickey
(74) *Attorney, Agent, or Firm* — Harness, Dickey & Pierce, P.L.C.

(57) ABSTRACT

An image sensor includes a photoelectric conversion element and a charge storage node coupled to the photoelectric conversion element. The charge storage node may store photocharges generated in the photoelectric conversion element. The charge storage node may include a floating diffusion region in a semiconductor substrate, a barrier dopant region on the floating diffusion region in the semiconductor substrate, and a charge drain region on the barrier dopant region in the semiconductor substrate, where the semiconductor substrate is associated with a first conductivity type, the floating diffusion region is associated with a second conductivity type, the barrier dopant region is associated with the first conductivity type, and the charge drain region is associated with the second conductivity type.

20 Claims, 12 Drawing Sheets

(56) References Cited

U.S. PATENT DOCUMENTS

| | | |
|---|---|---|
| 9,343,500 B2 | 5/2016 | Mabuchi |
| 9,564,465 B2 | 2/2017 | Tayanaka |
| 9,641,784 B2 | 5/2017 | Suzuki |
| 2015/0325606 A1* | 11/2015 | Togashi ................ H04N 5/361 250/208.1 |
| 2015/0372036 A1* | 12/2015 | Suh .................... H01L 27/1462 348/273 |
| 2017/0141144 A1 | 5/2017 | Yamakawa et al. |

FOREIGN PATENT DOCUMENTS

| | | |
|---|---|---|
| JP | 2016/021520 A | 2/2016 |
| JP | 2016/111425 A | 6/2016 |

* cited by examiner

IMAGE SENSORS

CROSS-REFERENCE TO RELATED APPLICATIONS

This U.S. non-provisional patent application claims priority under 35 U.S.C. § 119 to Korean Patent Application No. 10-2017-0047540, filed on Apr. 12, 2017, in the Korean Intellectual Property Office, the disclosure of which is hereby incorporated by reference in its entirety.

BACKGROUND

Example embodiments of the inventive concepts relate to image sensors and, more particularly, to image sensors with improved optical characteristics.

An image sensor is configured to convert an optical image (e.g., incident light that is incident on one or more portions of the image sensor from an external environment) into an electrical signal. As computer and communication industries have been developed, high-performance image sensors have been increasingly demanded in various fields such as digital cameras, camcorders, personal communication systems (PCS), game consoles, security cameras, and medical micro cameras.

Image sensors may be categorized as any one of charge coupled device (CCD) image sensors and complementary metal-oxide-semiconductor (CMOS) image sensors. CMOS image sensors may be simply driven. A CMOS image sensor may be realized ("implemented") as a single, individual chip on which a signal processing circuit and an image sensing part are integrated. Thus, a size of the CMOS image sensor may be reduced. Moreover, a CMOS image sensor may have very low power consumption so as to be configured to be easily applied to a product having a limited battery capacity. Furthermore, a CMOS image sensor may have high image sensing resolution based on the development of a CMOS technique. Accordingly, CMOS image sensors are widely used in various fields.

SUMMARY

Example embodiments of the inventive concepts may provide image sensors associated with improved optical characteristics.

According to some example embodiments, an image sensor may include a photoelectric conversion element configured to generate photocharges; and a charge storage node configured to be coupled to the photoelectric conversion element. The charge storage node may be configured to store photocharges generated in the photoelectric conversion element. The charge storage node may include a floating diffusion region in a semiconductor substrate, a barrier dopant region on the floating diffusion region in the semiconductor substrate, and a charge drain region on the barrier dopant region in the semiconductor substrate. The semiconductor substrate may be associated with a first conductivity type, the floating diffusion region may be associated with a second conductivity type, the barrier dopant region may be associated with the first conductivity type, and the charge drain region may be associated with the second conductivity type.

In some example embodiments, an image sensor may include a floating diffusion region in a semiconductor substrate, a charge drain region in the semiconductor substrate, a barrier dopant region between the floating diffusion region and the charge drain region in the semiconductor substrate, a buffer insulating layer on the semiconductor substrate, an organic photoelectric conversion element on the buffer insulating layer, and a first interconnection structure configured to couple the floating diffusion region to the bottom electrode of the organic photoelectric conversion element. The semiconductor substrate may be associated with a first conductivity type. The floating diffusion region may be associated with a second conductivity type. The charge drain region may be isolated from direct contact with the floating diffusion region. The charge drain region may be associated with the second conductivity type. The barrier dopant region may be associated with the first conductivity type. The organic photoelectric conversion element may include a bottom electrode, a top electrode, and an organic photoelectric conversion layer. The organic photoelectric conversion layer may be between the bottom electrode and the top electrode.

In some example embodiments, an image sensor may include a semiconductor substrate associated with a first conductivity type, an organic photoelectric conversion element on the semiconductor substrate, and a first charge storage node in the semiconductor substrate. The first charge storage node may include a first dopant region associated with a second conductivity type, a second dopant region associated with the second conductivity type, and a third dopant region associated with the first conductivity type, the third dopant region between the first dopant region and the second dopant region. The image sensor may further include a first interconnection structure configured to couple the organic photoelectric conversion element to the first dopant region of the first charge storage node, a photoelectric conversion region in the semiconductor substrate, the photoelectric conversion region and associated with the second conductivity type, a second charge storage node in the semiconductor substrate, the second charge storage node isolated from direct contact with the first charge storage node, the second charge storage node including a dopant associated with the second conductivity type, and a transfer transistor on the semiconductor substrate, the transfer transistor configured to transfer charges generated in the photoelectric conversion region to the second charge storage node.

BRIEF DESCRIPTION OF THE DRAWINGS

The inventive concepts will become more apparent in view of the attached drawings and accompanying detailed description.

DETAILED DESCRIPTION

Image sensors according to some example embodiments of the inventive concepts will be described hereinafter in detail with reference to the accompanying drawings.

Figure 1A:
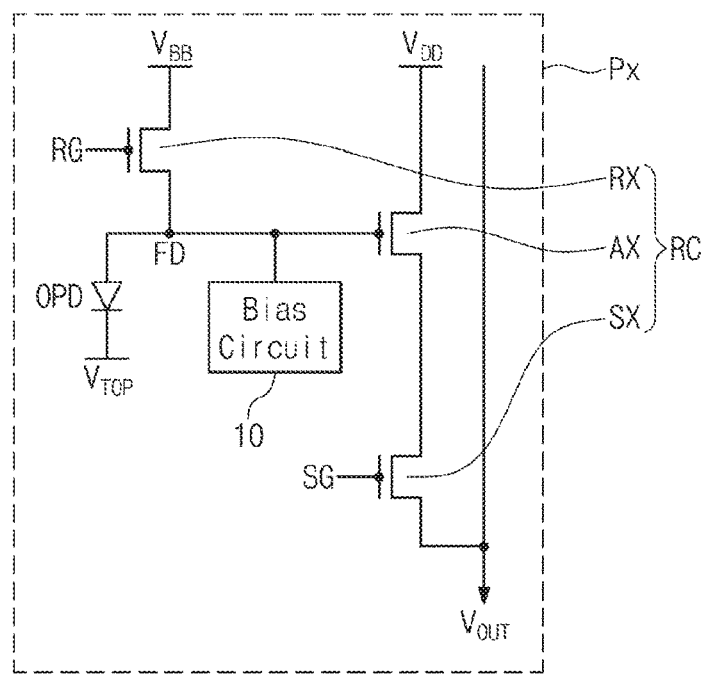
FIG. 1A and FIG. 1B are circuit diagrams illustrating unit pixels of image sensors according to some example embodiments of the inventive concepts.
Figure 1B:
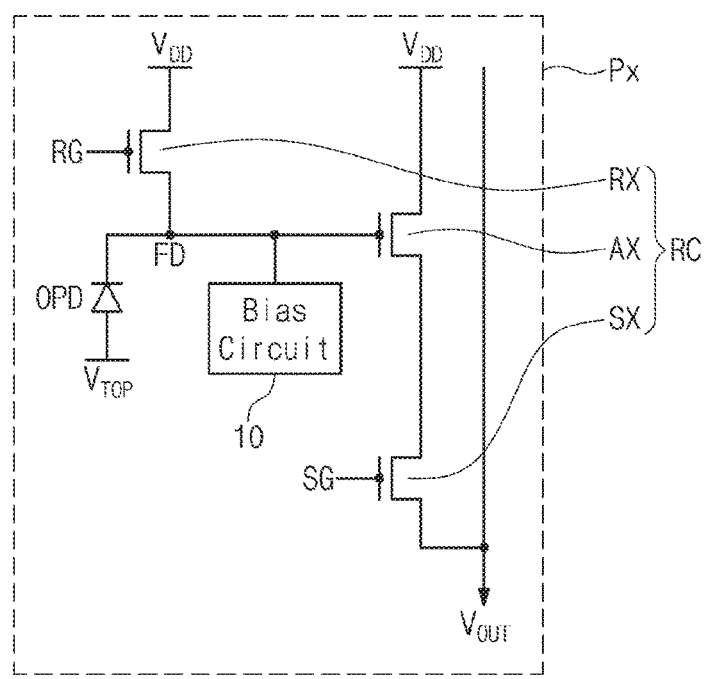

FIG. 1A and FIG. 1B are circuit diagrams illustrating unit pixels Px of image sensors according to some example embodiments of the inventive concepts.

Referring to FIGS. 1A and 1B, a unit pixel Px may include a photoelectric conversion element OPD and a readout circuit RC (collectively RX, AX, and SX). Here, the readout circuit RC may include a reset transistor RX, an amplifying transistor (or a source follower transistor) AX, and a selection transistor SX. As referred to herein the photoelectric conversion element OPD may be an organic photoelectric conversion element OPD.

In more detail, the photoelectric conversion element OPD may generate (and/or accumulate) one or more photocharges in proportion to the intensity of incident light (e.g., light beams incident on to the photoelectric conversion element OPD from an external environment). In some example embodiments, the photoelectric conversion element OPD may be an organic photoelectric conversion element that includes an organic material configured to generate one or more photocharges (i.e., electron-hole pairs) in proportion to the intensity of the incident light. The photoelectric conversion element OPD may be coupled, directly or indirectly, to a charge storage node FD that may be configured to store (and/or detect) the photocharges. As referred to herein, an element that is "coupled" to another element (including "electrically coupled") may include an element that is directly coupled to the other element (e.g., "connected" to the other element) or an element that is indirectly coupled to the other element. In some example embodiments, electrons or holes may be stored in the charge storage node FD based on a difference between voltages applied to both ends of the photoelectric conversion element OPD. FIG. 1A illustrates the unit pixel Px according to some example embodiments in which the photocharges detected in the charge storage node FD are holes, and FIG. 1B illustrates the unit pixel Px according to some example embodiments in which the photocharges detected in the charge storage node FD are electrons.

The charge storage node FD may receive charges generated in the photoelectric conversion element OPD and may cumulatively store the received charges. Gate potential of the amplifying transistor AX may be changed depending on the amount ("magnitude") of the photocharges accumulated in the charge storage node FD.

The reset transistor RX may periodically reset the charges accumulated in the charge storage node FD. In more detail, a gate electrode of the reset transistor RX may be coupled to a reset signal line RG to which a reset signal is provided. A drain of the reset transistor RX may be coupled to the charge storage node FD, and a reset voltage $V_{DD}/V_{BB}$ may be applied to a source of the reset transistor RX. For example, the reset voltage $V_{DD}/V_{BB}$ may be a power voltage $V_{DD}$ or a ground voltage $V_{BB}$. When the reset transistor RX is turned on by the reset signal, the reset voltage $V_{DD}/V_{BB}$ may be transmitted to the charge storage node FD. Thus, the photocharges accumulated in the charge storage node FD may be discharged to reset the charge storage node FD when the reset transistor RX is turned on.

In addition, according to some example embodiments of the inventive concepts, the photocharges generated in the photoelectric conversion element OPD in a state in which the reset transistor RX is turned off may be accumulated in the charge storage node FD. When the photocharges are stored in the charge storage node FD, a bias circuit 10 configured to apply a bias voltage (or a pickup voltage) may be coupled to the charge storage node FD to control photocharges overflowing or accumulated above a saturation storage capacity of the charge storage node FD. For example, the bias voltage may be a positive voltage (or a power voltage) or a negative voltage (or a ground voltage).

The amplifying transistor AX may be a source follower buffer amplifier that generates a source-drain current in proportion to the amount of the charges provided from the charge storage node FD to a gate electrode of the amplifying transistor AX. The amplifying transistor AX may amplify a change in potential of the charge storage node FD and may output the amplified pixel signal to an output line $V_{OUT}$ through the selection transistor SX. A drain of the amplifying transistor AX may be coupled to a pixel power voltage $V_{DD}$, and a source of the amplifying transistor AX may be coupled to a drain of the selection transistor SX.

A selection gate electrode of the selection transistor SX may be coupled to a selection line SG to which a selection signal may be provided. When the selection transistor SX is turned on by the selection signal, the pixel signal provided from the source of the amplifying transistor AX may be outputted to the output line $V_{OUT}$.

Figure 2A:
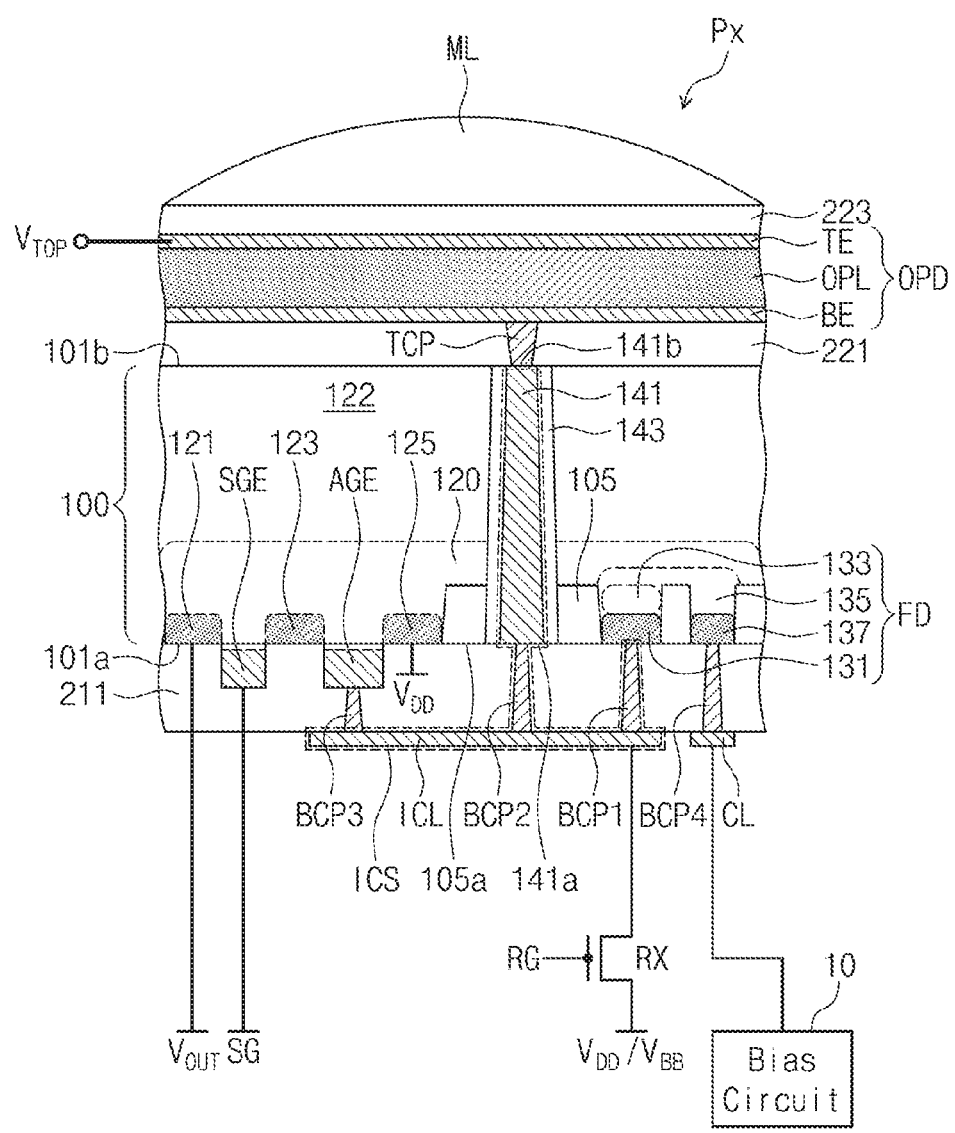
FIG. 2A and FIG. 2B are cross-sectional views illustrating unit pixels according to some example embodiments of the inventive concepts.
Figure 2B:
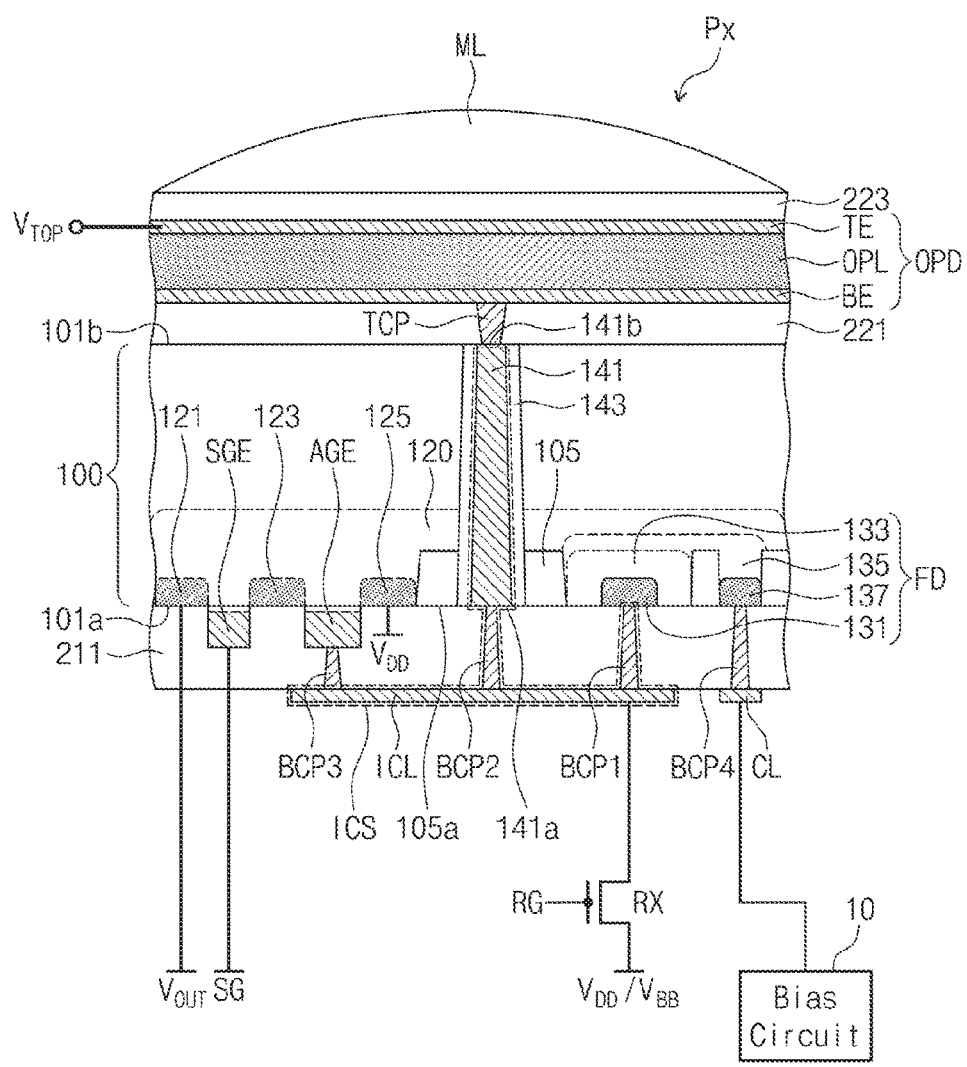

FIG. 2A and FIG. 2B are cross-sectional views illustrating unit pixels according to some example embodiments of the inventive concepts.

Referring to FIGS. 2A and 2B, a unit pixel Px may include a semiconductor substrate 100 having ("associated with") a first conductivity type (e.g., a P-type). The semiconductor substrate 100 may be a silicon epitaxial layer doped with dopants having the first conductivity type. The semiconductor substrate 100 may have a first surface (or a front surface) 101a and a second surface (or a back surface) 101b, which are opposite to each other.

According to some example embodiments, readout circuits RC and connection lines ICL and CL coupled thereto may be provided on the first surface 101a of the semiconductor substrate 100. In other words, the reset, amplifying and selection transistors RX, AX and SX described with reference to FIGS. 1A and 1B may be disposed ("located") on the first surface 101a of the semiconductor substrate 100. A photoelectric conversion element OPD and a micro lens ML may be provided ("located") on the second surface 101b of the semiconductor substrate 100. The photoelectric conversion element OPD may be electrically coupled to the readout circuit RC through the connection lines ICL and CL. In other words, the photoelectric conversion element OPD may be electrically coupled to a charge storage node FD of the readout circuit through the connection lines ICL and CL.

In the embodiments of the FIGS. 2A and 2B, the readout circuit RC is provided on the first surface 101a of the semiconductor substrate 100 and the photoelectric conversion element OPD is provided on the second surface 101b of the semiconductor substrate 100. However, example embodiments of the inventive concepts are not limited thereto. In some example embodiments, the readout circuit RC, the photoelectric conversion element OPD, and the micro lens ML may be provided on the first surface 101a of the semiconductor substrate 100.

In some example embodiments, a well dopant layer 120 having ("associated with") the first conductivity type (e.g., the P-type) may be formed ("located") in the semiconductor substrate 100 and may be adjacent to the first surface 101a of the semiconductor substrate 100. A concentration of the first conductivity type dopants in the well dopant layer 120 may be greater than a concentration of the first conductivity type dopants in a remainder portion 122 of the semiconductor substrate 100 that is external to the well dopant layer 120. As referred to herein, an element that is "in" another element will be understood to be an element that is at least partially within a volume defined by the outer boundaries of the other element, such that the element is partially or entirely covered by the other element from exposure to an environment external to the volume defined by the outer boundaries of the other element.

A device isolation layer 105 may be provided in the well dopant layer 120 and may be configured to define active regions. In some example embodiments, a bottom surface 105a of the device isolation layer 105 may be disposed in the well dopant layer 120. In some example embodiments, a patterning process may be performed on the first surface 101a of the semiconductor substrate 100 to form a shallow trench, and then, the device isolation layer 105 may be formed by filling the shallow trench with an insulating material. In some example embodiments, the device isolation layer 105 may be a dopant region having the same conductivity type ("a common conductivity type") as the well dopant layer 120. A "region" may be interchangeably referred to herein as a "pattern" and/or a "layer." For example, the dopant region may be referred to as a dopant pattern and/or a dopant layer. In some example embodiments, a concentration of the first conductivity type dopants in the device isolation layer 105 may be greater than the concentration of the first conductivity type dopants in the well dopant layer 120.

The amplifying transistor AX (see FIGS. 1A and 1B), the reset transistor RX (see FIGS. 1A and 1B), and the selection transistor SX (see FIGS. 1A and 1B) may be provided on a surface of the well dopant layer 120, which is adjacent to the first surface 101a of the semiconductor substrate 100. In some example embodiments, the well dopant layer 120 may be omitted.

In more detail, a selection gate electrode SGE, an amplifying gate electrode AGE, and a reset gate electrode RGE (not shown in FIGS. 2A and 2B) may be disposed on the surface of the well dopant layer 120 with gate insulating layers interposed therebetween and may be spaced apart from (isolated from direct contact with) each other such that the SGE, AGE, and RGE are isolated from direct contact with each other.

A first source/drain region 121 may be formed in the well dopant layer 120 at a side of (e.g., adjacent to a side edge of) the selection gate electrode SGE, and a second source/drain region 123 may be formed in the well dopant layer 120 between the selection gate electrode SGE and the amplifying gate electrode AGE. A third source/drain region 125 may be formed in the well dopant layer 120 at another side of the amplifying gate electrode AGE.

In some example embodiments, the charge storage node FD may include a floating diffusion region 131, a charge drain region 135 on the floating diffusion region 131, and a barrier dopant region 133 disposed between the floating diffusion region 131 and the charge drain region 135 such that the barrier dopant region 133 is on the floating diffusion region 131 and the charge drain region 135 is on the barrier dopant region 133. As referred to herein, an element that is "on" another element may be above or under the element. An element that is "on" another element may be in direct contact with ("directly on") the other element or may be in indirect contact with the other element (e.g., at least a third element may be between the element and the other element). The barrier dopant region 133 may have ("may be associated with") the first conductivity type. The floating diffusion region 131 and the charge drain region 135 may have ("may be associated with") a second conductivity type (e.g., an N-type) different from the first conductivity type. In other words, the charge storage node FD may have an N/P/N junction structure. As shown in FIGS. 2A and 2B, each of the floating diffusion region 131, the barrier dopant region 133, and the charge drain region 135 may be in the semiconductor substrate 100.

The floating diffusion region 131 (i.e., a charge storage region) may be provided in the well dopant layer 120 and may be spaced apart from (e.g., isolated from direct contact with) the first to third source/drain regions 121, 123, and 125 by the device isolation layer 105.

The first to third source/drain regions 121, 123, and 125 and the floating diffusion region 131 may be formed by ion-implanting dopants of the second conductivity type (e.g., the N-type) into the well dopant layer 120. In other words, the first to third source/drain regions 121, 123, and 125 may also have the second conductivity type.

In some example embodiments, the barrier dopant region 133 may be provided in the well dopant layer 120 so as to be in contact with the floating diffusion region 131. The barrier dopant region 133 may include dopants of the first conductivity type opposite to the second conductivity type of the floating diffusion region 131. A concentration of the first conductivity type dopants ("dopants associated with the first conductivity type") in the barrier dopant region 133 may be less than a concentration of the second conductivity type dopants ("dopants associated with the second conductivity type") in the floating diffusion region 131.

In some example embodiments, the barrier dopant region 133 may be in contact with a portion (e.g., a top surface) of the floating diffusion region 131, as illustrated in FIG. 2A. As further shown in FIG. 2A, the barrier dopant region may be isolated from direct contact with the lower insulating layer 211, described further below, by the floating diffusion region 131. In some example embodiments, the barrier dopant region 133 may be formed in the well dopant layer 120 to surround the floating diffusion region 131, as illustrated in FIG. 2B, such that the barrier dopant region 133 extends over a top surface and one or more side surfaces of the floating diffusion region 131. As further illustrated in FIG. 2B, the barrier dopant region 133 may surround the floating diffusion region 131 such that the barrier dopant region is in contact with the lower insulating layer 211 that is described further below.

In some example embodiments, the barrier dopant region 133 may provide a potential barrier between the floating diffusion region 131 and the charge drain region 135. In addition, a depletion region may be formed between the barrier dopant region 133 and the floating diffusion region 131.

The charge drain region 135 may be provided in the well dopant layer 120 so as to be in contact with the barrier dopant region 133. In addition, the charge drain region 135 may couple the barrier dopant region 133 to a pickup dopant region 137, such that the charge storage node FD further includes the pickup dopant region 137. The charge drain region 135 may include dopants of the second conductivity type. A concentration of the second conductivity type dopants of the charge drain region 135 may be less than the concentration of the second conductivity type dopants of the floating diffusion region 131.

The pickup dopant region 137 may be spaced apart from (isolated from direct contact with) the floating diffusion region 131 and the barrier dopant region 133 by the device isolation layer 105 and may be provided in the charge drain region 135. The pickup dopant region 137 may have the same conductivity type as the floating diffusion region 131. In other words, the pickup dopant region 137 may include dopants of the second conductivity type and thus may be associated with the second conductivity type. A concentration of the second conductivity type dopants of the pickup dopant region 137 may be higher than the concentration of the second conductivity type dopants of the charge drain region 135.

In some example embodiments, a through-electrode 141 may vertically extend from the first surface 101a to the second surface 101b of the semiconductor substrate 100 through the semiconductor substrate 100, thereby penetrating the semiconductor substrate 100. The through-electrode 141 may include a conductive material. The through-electrode 141 may include at least one of poly-silicon doped with N-type or P-type dopants or a metal material. The through-electrode 141 may have a top surface 141b substantially coplanar (e.g., coplanar within manufacturing tolerances and/or material tolerances) with the second surface 101b of the semiconductor substrate 100 and a bottom surface 141a substantially coplanar with the first surface 101a of the semiconductor substrate 100.

A through insulating pattern 143 may be provided in the semiconductor substrate 100 and may surround the through-electrode 141 such that the through insulating pattern 143 isolates the through-electrode from direct contact with the semiconductor substrate 100. For example, the through insulating pattern 143 may include at least one of silicon oxide, silicon nitride, or silicon oxynitride.

A lower insulating layer 211 may be disposed on the first surface 101a of the semiconductor substrate 100. The lower insulating layer 211 may cover the gate electrodes SGE and AGE of the MOS transistors constituting the readout circuit. The lower insulating layer 211 may also cover the top surface of the through-electrode 141.

A plurality of bottom contact plugs BCP may be provided in the lower insulating layer 211, such that one or more of the bottom contact plugs penetrates the lower insulating layer 211. For example, in FIGS. 2A and 2B, the plurality of bottom contact plugs BCP includes first through fourth bottom contact plugs BCP1 to BCP4. Each of the bottom contact plugs BCP may include a barrier metal layer and a metal layer. For example, the barrier metal layer may be formed of (e.g., may at least partially comprise) a metal nitride such as titanium nitride, tantalum nitride, tungsten nitride, hafnium nitride, and/or zirconium nitride. The metal layer may be formed of (e.g., may at least partially comprise) at least one of tungsten, copper, hafnium, zirconium, titanium, tantalum, aluminum, ruthenium, palladium, platinum, cobalt, nickel, or any conductive metal nitride thereof. In addition, in some example embodiments, a silicide layer may be formed between each of the bottom contact plugs BCP and the dopant region coupled thereto.

An interconnection line ICL and a connection line CL may be provided on the lower insulating layer 211. The floating diffusion region 131 may be electrically coupled to the amplifying gate electrode AGE and the drain of the reset transistor RX through the interconnection line ICL and some of the bottom contact plugs BCP (e.g., the first bottom contact plug BCP1 and the third bottom contact plug BCP3). In addition, the floating diffusion region 131 may be electrically coupled to the through-electrode 141 through the interconnection line ICL and another of the bottom contact plugs BCP (e.g., the first bottom contact plug BCP1 may penetrate the lower insulating layer 211 such that the first bottom contact plug BCP1 is coupled to the floating diffusion region 131).

The connection line CL may be electrically coupled to the pickup dopant region 137 through still another of the bottom contact plugs BCP (e.g., the fourth bottom contact plug BCP4). The connection line CL may be coupled to a bias circuit 10 that applies a bias voltage to the pickup dopant region 137, such that the connection line CL is configured to provide a bias voltage to the pickup dopant region 137. As referred to herein, the aforementioned interconnection structure ICS may be referred to as a "first interconnection structure," and the connection line CL and bottom contact plug BCP4 may be collectively be referred to as a second interconnection structure.

According to some example embodiments, the photoelectric conversion element OPD may be provided on the second surface 101b of the semiconductor substrate 100 with a buffer insulating layer 221 interposed therebetween. The photoelectric conversion element OPD may be electrically coupled to the floating diffusion region 131 through a top contact plug TCP, the through-electrode 141, the first bottom contact plug BCP1, the interconnection line ICL, and the second bottom contact plug BCP2. For example, the through-electrode 141 may penetrate the semiconductor substrate 100 such that the through-electrode is coupled to the bottom electrode BE of the photoelectric conversion element OPD, and the second bottom contact plug BCP2 may penetrate the lower insulating layer 211 such that the second bottom contact plug BCP2 is coupled to the through-electrode 141. Collectively, at least the through-electrode 141, the first bottom contact plug BCP1, the second bottom contact plug BCP2, and the interconnection line ICL may comprise an interconnection structure ICS (also referred to herein as a first interconnection structure) that is configured to couple the photoelectric conversion element OPD to the charge storage node FD. As shown in FIGS. 2A and 2B, the interconnection structure ICS may couple the floating diffusion region 131 to the bottom electrode BE of a photoelectric conversion element OPD. The interconnection line ICL may couple one or more bottom contact plugs BCP (e.g., the first bottom contact plug BCP1 and the second bottom contact plug BCP2) to each other. In some example embodiments, the interconnection structure ICS may further include the lower insulating layer 211. In some example embodiments, the interconnection structure ICS may further include the top contact plug TCP. It will be understood that, in some example embodiments, the photoelectric conversion element OPD may be coupled to the charge storage node FD via one or more structures that may encompass the interconnection structure ICS and/or may be different from the interconnection structure ICS. It will be understood that, in some example embodiments, the photoelectric conversion element OPD may be coupled to the charge storage node FD via one or more structures that may be separate from the interconnection structure as described herein.

In more detail, the photoelectric conversion element OPD may include a bottom electrode BE, a top electrode TE, and an organic photoelectric conversion layer OPL disposed between the bottom and top electrodes BE and TE. As referred to herein, an electrode may be referred to as a "terminal." For example, the photoelectric conversion element OPD may include a terminal (e.g., bottom electrode BE) with which the through-electrode 141 is coupled via the top contact plug TCP.

The organic photoelectric conversion layer OPL may include an organic material in which an electron-donating organic material and an electron-accepting organic material are mixed with each other. In other words, the organic photoelectric conversion layer OPL may be formed of (e.g., may at least partially comprise) the organic material in which an N-type organic material corresponding to the electron-donating organic material is mixed with a P-type organic material corresponding to the electron-accepting organic material. Thus, the organic photoelectric conversion layer OPL may have a bulk heterojunction-type PN junction structure. The organic photoelectric conversion layer OPL may selectively absorb light of a specific wavelength band ("wavelength spectrum") and may convert the absorbed light into an electrical signal. According to some example embodiments, the organic photoelectric conversion layer OPL may be included in each pixel of a blue pixel, a green pixel, and a red pixel.

For example, the organic photoelectric conversion layer OPL may include coumarin30:C60 or tris(8-hydroxyquinolinato)aluminum (Alq3) as an organic material converting light of a blue wavelength band into an electrical signal. The organic photoelectric conversion layer OPL may include boron subphthalocyanine chloride (SubPc), N,-N' dimethyl quinacridone (DMQA), or dibutyl substituted dicyanovinyl-terthiophene (DCV3T) as an organic material converting light of a green wavelength band into an electrical signal. The organic photoelectric conversion layer OPL may include zinc phthalocyanine (ZnPc), titanyl phthalocyanine (TiOPc), or Alq3 as an organic material converting light of a red wavelength band into an electrical signal.

The bottom and top electrodes BE and TE may be formed of (e.g., may at least partially comprise) a transparent conductive oxide. For example, the bottom and top electrodes BE and TE may include at least one of indium tin oxide (ITO), indium zinc oxide (IZO), zinc oxide (ZnO), $SnO_2$, antimony-doped tin oxide (ATO), aluminum-doped zinc oxide (AZO), gallium-doped zinc oxide (GZO), $TiO_2$, or fluorine-doped tin oxide (FTO).

An upper insulating layer 223 may be disposed on the top electrode TE, and a micro lens ML may be disposed on the upper insulating layer 223. The micro lens ML may have a convex shape and may have a specific ("particular") radius of curvature.

Figure 3A:
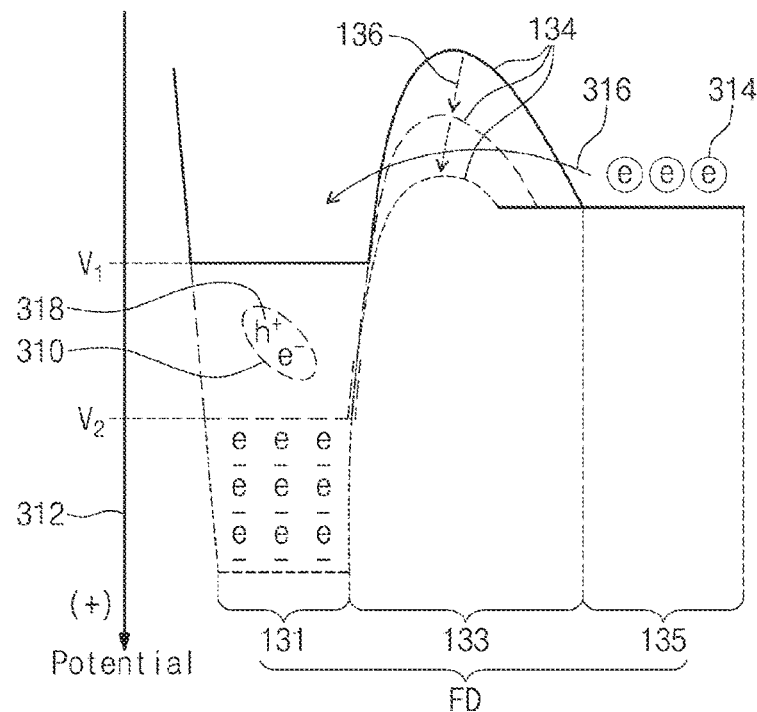
FIG. 3A and FIG. 3B are potential diagrams of image sensors according to some example embodiments of the inventive concepts.
Figure 3B:
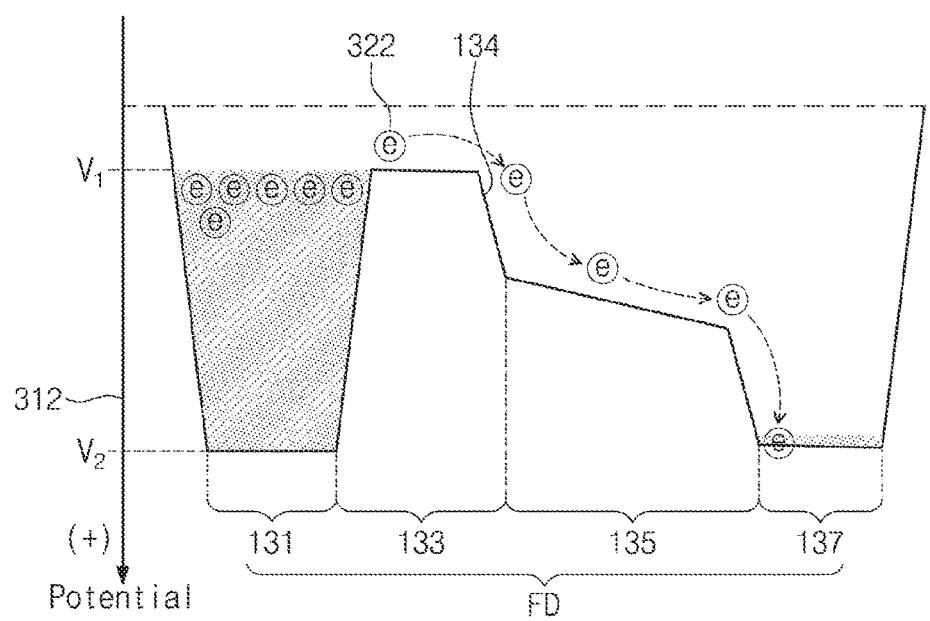

FIG. 3A and FIG. 3B are potential diagrams of image sensors according to some example embodiments of the inventive concepts.

FIG. 3A illustrates a potential level of the charge storage node FD of the unit pixel Px illustrated in FIG. 1A. FIG. 3B illustrates a potential level of the charge storage node FD of the unit pixel Px illustrated in FIG. 1B.

Referring to FIGS. 1A, 2A, and 3A, the reset signal may be activated if and/or when the unit pixel Px is in a state in which light is blocked, and thus the reset transistor RX may be turned on ("activated"). Therefore, the reset voltage $V_{BB}$ (e.g., the ground voltage or the negative voltage) may be applied to the floating diffusion region 131, and thus charges stored in the floating diffusion region 131 may be discharged to reset (or initialize) the floating diffusion region 131.

Thereafter, the reset signal may be inactivated ("deactivated") to turn the reset transistor RX off (e.g., "deactivate" the reset transistor RX), and external light may be incident on the organic photoelectric conversion layer OPL of the unit pixel Px to cause the generation of electron-hole pairs in the organic photoelectric conversion layer OPL. At this time (e.g., concurrently with external light being incident on the organic photoelectric conversion layer OPL), a positive voltage may be applied to the top electrode TE of the photoelectric conversion element OPD and a negative voltage may be applied to the bottom electrode BE of the photoelectric conversion element OPD. Under these conditions, electrons may move to the top electrode TE and holes may be transferred ("transmitted") to the floating diffusion region 131 through the bottom electrode BE.

Since electrons exist in the N+ floating diffusion region 131, the holes transmitted ("transferred") from the photoelectric conversion element OPD to the floating diffusion region 131 may be recombined with the electrons of the N+ floating diffusion region 131 to disappear.

In some example embodiments, the holes may be stored in the N+ floating diffusion region 131 until an electric field applied to the organic photoelectric conversion layer OPL disappears. In other words, a potential 312 of the N+ floating diffusion region 131 may increase above a saturation level $V_2$ (i.e., a potential applied to the top electrode TE).

In some example embodiments, since the N+ floating diffusion region 131 is in contact with the p-barrier dopant region 133, a height ("magnitude") of a potential barrier 134 of the barrier dopant region 133 may be reduced 136 as the potential 312 of the floating diffusion region 131 is increased by the photocharges (e.g., the magnitude of the potential barrier of the barrier dopant region 133 may be in an inverse relationship with the potential of the floating diffusion region 131. Since the potential barrier 134 of the barrier dopant region 133 is reduced 136, electrons 314 may be provided 316 from the charge drain region 135, to which a bias voltage (e.g., a ground voltage or a negative voltage) is applied, to the floating diffusion region 131 beyond the barrier dopant region 133. The electrons 314 provided from the charge drain region 135 may be combined 310 with the accumulated holes 318 above the saturation level in the N+ floating diffusion region 131. Thus, the potential 312 of the N+ floating diffusion region 131 may be mitigated, inhibited and/or prevented from increasing above the saturation level $V_2$. As a result, a magnitude of the reset voltage for resetting the floating diffusion region 131 may be mitigated, inhibited and/or prevented from increasing. In addition, since the increase in potential of the floating diffusion region 131 may be inhibited, the electric field applied to the organic photoelectric conversion layer OPL may be reduced such that an image lag phenomenon that may be caused by holes remaining in the organic photoelectric conversion layer OPL may be mitigated, inhibited, and/or prevented. As a result, performance of a unit pixel Px that includes the charge storage node FD (e.g., a charge node FD as shown in FIGS. 1A, 2A, and 3A) may be improved based on the reduction of the image lag phenomenon as a result of the operation of the charge storage node FD as shown in FIG. 3A.

Referring to FIGS. 1B, 2A, and 3B, if and/or when the reset transistor RX is turned on, the reset voltage $V_{DD}$ (e.g., the power voltage or the positive voltage) may be applied to the floating diffusion region 131. Thus, charges stored in the floating diffusion region 131 may be discharged to cause the floating diffusion region 131 to be reset and/or initialized.

Thereafter, the reset signal may be inactivated to turn the reset transistor RX off, and external light may be incident on the organic photoelectric conversion layer OPL to cause generation of electron-hole pairs in the organic photoelectric conversion layer OPL. At this time (e.g., "concurrently" with the generation of electron-hole pairs in the organic photoelectric conversion layer OPL), a negative voltage may be applied to the top electrode TE of the photoelectric conversion element OPD and a positive voltage may be applied to the bottom electrode BE of the photoelectric conversion element OPD. Under these conditions, holes may move to the top electrode TE and electrons may be transferred to the floating diffusion region 131 through the bottom electrode BE. At this time, electrons above a storage capacity of the N+ floating diffusion region 131 may be transferred from the photoelectric conversion element OPD to the N+ floating diffusion region 131. In some example embodiments, excess electrons 322 may be discharged from the floating diffusion region 131 to the pickup dopant region 137 beyond the potential barrier 134 of the barrier dopant region 133 through the charge drain region 135. At this time, a predetermined bias voltage (e.g., a positive voltage or the power voltage) may be applied to the pickup dopant region 137.

Figure 4:
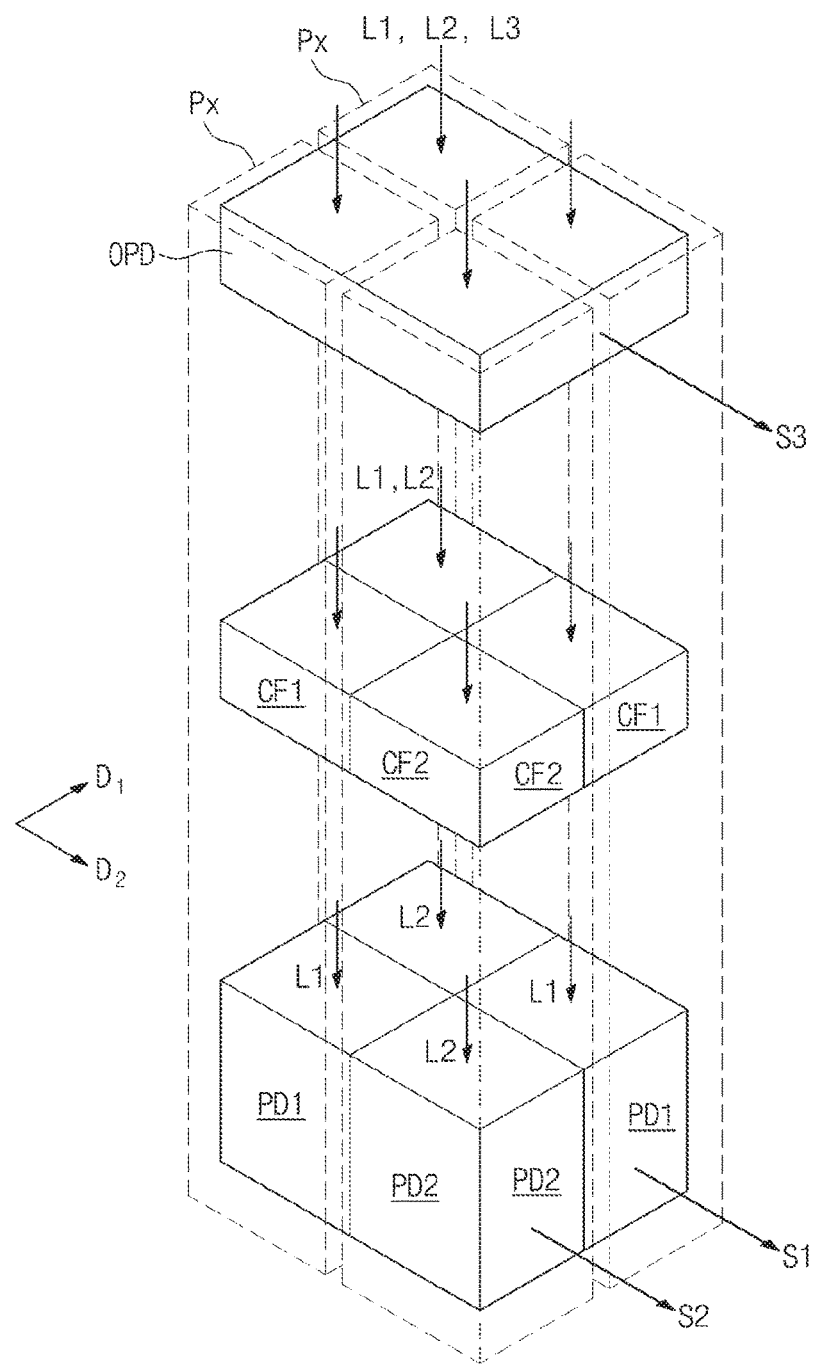
FIG. 4 is a schematic block diagram illustrating an image sensor according to some example embodiments of the inventive concepts.

FIG. 4 is a schematic block diagram illustrating an image sensor according to some example embodiments of the inventive concepts.

Referring to FIG. 4, each of the unit pixels Px of an image sensor may include a first sub-pixel and a second sub-pixel and may have a structure in which at least two photoelectric conversion elements are stacked.

The first sub-pixel may include a first or second photoelectric conversion element PD1 or PD2 and a first readout circuit RC1. The second sub-pixel may include an organic photoelectric conversion element OPD and a second readout circuit RC2. The first readout circuit RC1 may sense first photocharges generated in the first photoelectric conversion element PD1 or second photocharges generated in the second photoelectric conversion element PD2 and may output a first or second pixel signal S1 or S2 corresponding to the first or second photocharges, respectively. The second readout circuit RC2 may sense third photocharges generated in the organic photoelectric conversion element OPD and may output a third pixel signal S3 corresponding to the third photocharges.

In some example embodiments, the organic photoelectric conversion element OPD may be stacked on the first or second photoelectric conversion element PD1 or PD2. In other words, the organic photoelectric conversion element OPD may overlap with the first or second photoelectric conversion element PD1 or PD2 when viewed in a plan view (e.g., a direction that is perpendicular to a top surface of a substrate included in the unit pixel Px).

The first and second photoelectric conversion elements PD1 and PD2 may be alternately and repeatedly arranged in a first direction D1 and may be alternately and repeatedly arranged in a second direction D2 intersecting the first direction. A first color filter CF1 may be provided between the first photoelectric conversion element PD1 and the organic photoelectric conversion element OPD, and a second color filter CF2 may be provided between the second photoelectric conversion element PD2 and the organic photoelectric conversion element OPD.

Lights ("light beams") of ("associated with") different wavelength bands may be incident on the first and second photoelectric conversion elements PD1 and PD2 and the organic photoelectric conversion element OPD, respectively. The first and second photoelectric conversion elements PD1 and PD2 and the organic photoelectric conversion element OPD may generate photocharges in proportion to the intensities of incident lights.

In some example embodiments, the first photoelectric conversion element PD1 may generate the first photocharges corresponding to incident light of ("associated with") a first wavelength band. The second photoelectric conversion element PD2 may generate the second photocharges corresponding to incident light of a second wavelength band. The organic photoelectric conversion element OPD may generate the third photocharges corresponding to incident light of a third wavelength band.

Light L1 of the first wavelength band may be incident on the first photoelectric conversion element PD1, and light L2 of the second wavelength band may be incident on the second photoelectric conversion element PD2. Light L3 of the third wavelength band may be incident on the organic photoelectric conversion element OPD. Here, the first wavelength band may be longer than the third wavelength band, and the second wavelength band may be shorter than the third wavelength band. For example, the first photoelectric conversion element PD1 may generate photocharges corresponding to red light. The second photoelectric conversion element PD2 may generate photocharges corresponding to blue light. The organic photoelectric conversion element OPD may generate photocharges corresponding to green light. In other words, the red light may pass through the first color filter CF1 and may be then incident on the first photoelectric conversion element PD1, and the blue light may pass through the second color filter CF2 and may be then incident on the second photoelectric conversion element PD2.

Figure 5A:
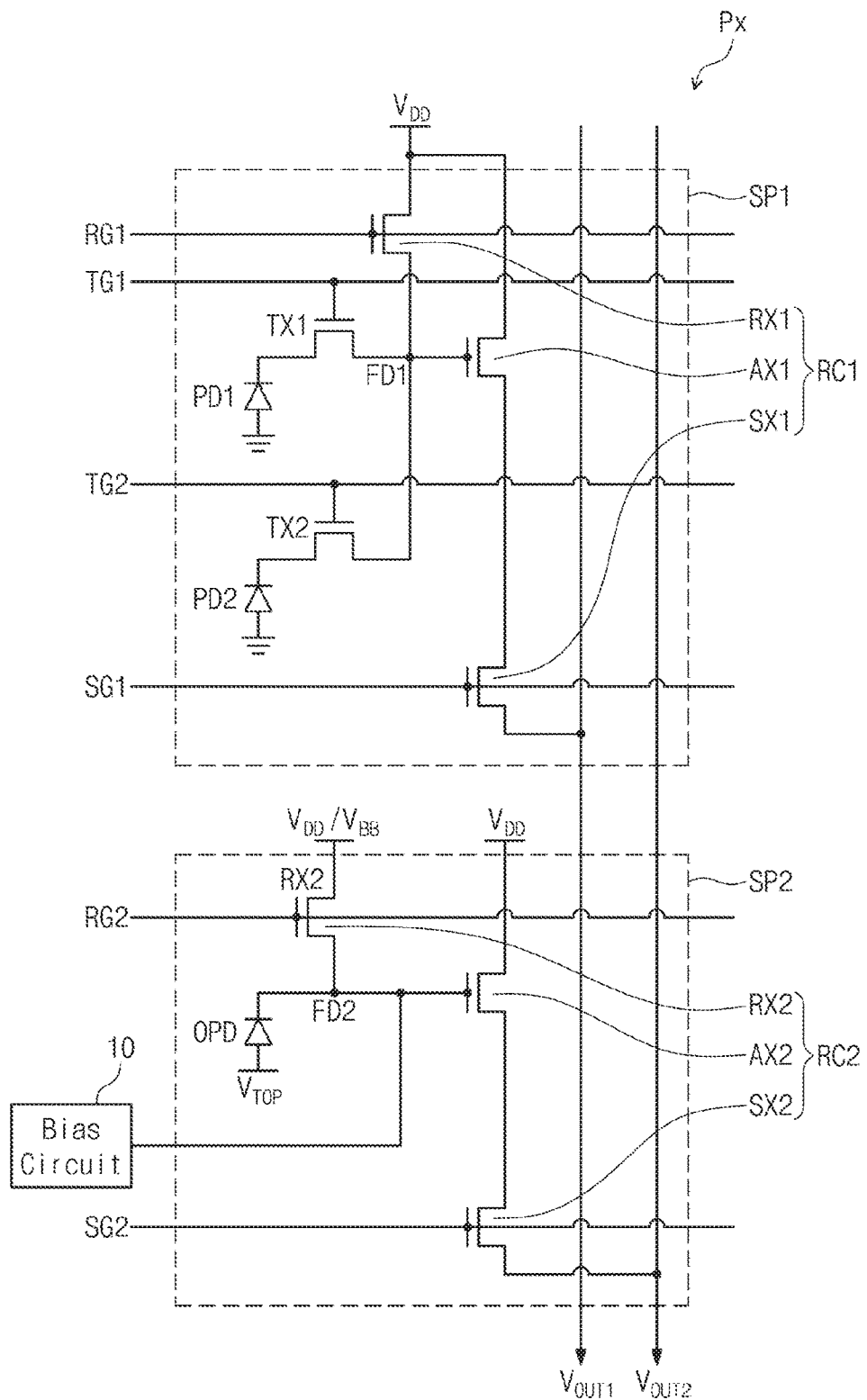
FIG. 5A and FIG. 5B are circuit diagrams illustrating unit pixels of image sensors according to some example embodiments of the inventive concepts.
Figure 5B:
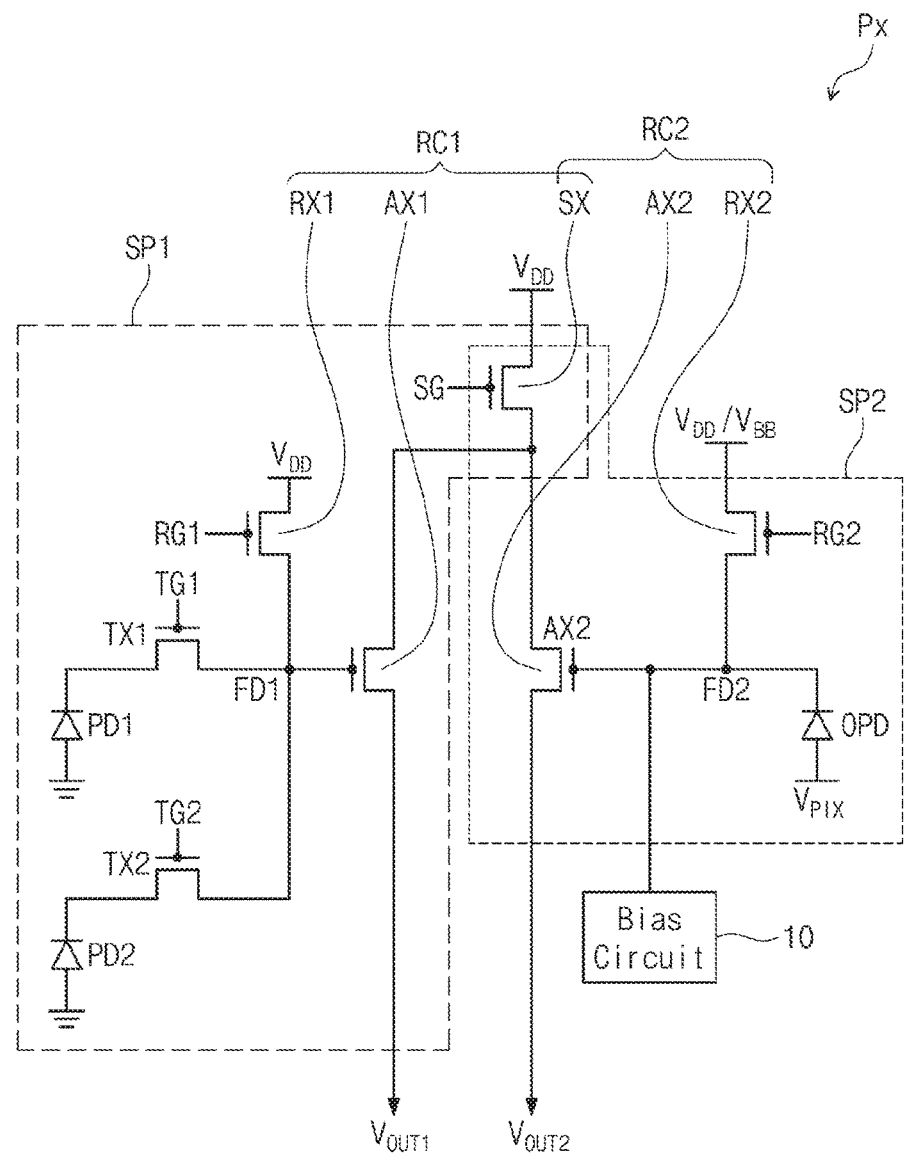

FIGS. 5A and 5B are circuit diagrams illustrating unit pixels of image sensors according to some example embodiments of the inventive concepts.

Referring to FIGS. 5A and 5B, a unit pixel Px may include a first sub-pixel SP1 and a second sub-pixel SP2.

The first sub-pixel SP1 may include first and second photoelectric conversion elements PD1 and PD2, first and second transfer transistors TX1 and TX2, and a first readout circuit RC1. The second sub-pixel SP2 may include an organic photoelectric conversion element OPD and a second readout circuit RC2 coupled to the organic photoelectric conversion element OPD.

The first sub-pixel SP1 may output a first or second pixel signal to a first output line $V_{OUT1}$. The second sub-pixel SP2 may output a third pixel signal to a second output line $V_{OUT2}$.

According to the example embodiments illustrated in FIG. 5A, the first and second transfer transistors TX1 and TX2 of the first sub-pixel SP1 may share a first charge storage node FD1 and the first readout circuit RC1. Here, the first readout circuit RC1 may include a first reset transistor RX1, a first amplifying transistor AX1, and a first selection transistor SX1. The first readout circuit RC1 may sense and amplify photocharges from the first or second photoelectric conversion element PD1 or PD2 and may output the first or second pixel signal to the first output line $V_{OUT1}$.

In more detail, the first and second photoelectric conversion elements PD1 and PD2 may generate and accumulate the photocharges in proportion to the amount (or intensity) of light incident from the outside (e.g., light beams incident on the unit pixel Px from an environment external to the unit pixel Px). Each of the first and second photoelectric conversion elements PD1 and PD2 may include a photodiode, a photo transistor, a photo gate, a pinned photodiode (PPD), or any combination thereof.

The first and second transfer transistors TX1 and TX2 may be configured to transfer charges, which are accumulated in the first and second photoelectric conversion elements PD1 and PD2, respectively, to the first charge storage node FD1. The first and second transfer transistors TX1 and TX2 may be controlled by charge transfer signals provided through first and second charge transfer lines TG1 and TG2. Depending on the charge transfer signals applied to the first and second transfer transistors TX1 and TX2, the charges may be transferred from one of the first and second photoelectric conversion elements PD1 and PD2 to the first charge storage node FD1. In other words, the charge transfer signals provided through the first and second charge transfer lines TG1 and TG2 may be opposite or complementary to each other.

The first charge storage node FD1 may receive the charges generated in one of the first and second photoelectric conversion elements PD1 and PD2 and may cumulatively store the received charges. A potential of a gate electrode of the first amplifying transistor AX1 may be changed depending on the amount of the charges accumulated in the first charge storage node FD1.

The first reset transistor RX1 may periodically reset charges accumulated in the first charge storage node FD1. In more detail, a gate electrode of the first reset transistor RX1 may be coupled to a first reset signal line RG1 to which a first reset signal is provided. A drain of the first reset transistor RX1 may be coupled to the first charge storage node FD1, and a source of the first reset transistor RX1 may be coupled to a power voltage $V_{DD}$. When the first reset transistor RX1 is turned on by the first reset signal, the power voltage $V_{DD}$ coupled to the source of the first reset transistor RX1 may be transmitted to the first charge storage node FD1. In other words, the charges accumulated in the first charge storage node FD1 may be discharged to reset the first charge storage node FD1 when the first reset transistor RX1 is turned on.

The first amplifying transistor AX1 may amplify the potential change (i.e., the first or second pixel signal) of the first charge storage node FD1 and may output the amplified first or second pixel signal to the first output line $V_{OUT1}$ through the first selection transistor SX1. The first amplifying transistor AX1 may be a source follower buffer amplifier that generates a source-drain current in proportion to the amount of the photocharges provided to a gate electrode thereof. A gate electrode of the first amplifying transistor AX1 may be coupled to the first charge storage node FD1, a drain of the first amplifying transistor AX1 may be coupled to the power voltage $V_{DD}$, and a source of the first amplifying transistor AX1 may be coupled to a drain of the first selection transistor SX1.

The first sub-pixel SP1 to be sensed in the unit of row may be selected by the first selection transistor SX1. A selection gate electrode of the first selection transistor SX1 may be coupled to a first selection line SG1 to which a first selection signal is provided. When the first selection transistor SX1 is turned on by the first selection signal, the first or second pixel signal provided from the source of the first amplifying transistor AX1 may be outputted to the first output line $V_{OUT1}$ through the first selection transistor SX1.

In some example embodiments, the second sub-pixel SP2 may have substantially the same (e.g., the same within manufacturing tolerances and/or material tolerances) elements as the unit pixel described with reference to FIG. 1A or 1B.

In more detail, the second readout circuit RC2 of the second sub-pixel SP2 may include a second reset transistor RX2, a second amplifying transistor AX2, and a second selection transistor SX2.

The organic photoelectric conversion element OPD may be coupled to a second charge storage node FD2 that stores and detects photocharges generated in the organic photoelectric conversion element OPD. The organic photoelectric conversion element OPD may include an organic photoelectric conversion layer which generates photocharges (electron-hole pairs) in proportion to the amount (or intensity) of incident light, as described above.

The second reset transistor RX2 may periodically reset charges accumulated in the second charge storage node FD2. In more detail, a gate electrode of the second reset transistor RX2 may be coupled to a second reset signal line RG2 to which a second reset signal is provided. A drain of the second reset transistor RX2 may be coupled to the second charge storage node FD2, and a source of the second reset transistor RX2 may be coupled to a reset voltage $V_{DD}$ or $V_{BB}$. When the second reset transistor RX2 is turned on by the second reset signal, the reset voltage $V_{DD}$ or $V_{BB}$ may be transmitted to the second charge storage node FD2. In other words, the charges accumulated in the second charge storage node FD2 may be discharged to reset the second charge storage node FD2 when the second reset transistor RX2 is turned on.

In addition, the second charge storage node FD2 may be coupled to a bias circuit 10 which provides a bias voltage (or a pickup voltage) to the second charge storage node FD2.

The second amplifying transistor AX2 may amplify a potential change (i.e., the third pixel signal) of the second charge storage node FD2 and may output the amplified third pixel signal to a second output line $V_{OUT2}$ through the second selection transistor SX2. The second amplifying transistor AX2 may be a source follower buffer amplifier that generates a source-drain current in proportion to the amount of the photocharges provided to a gate electrode thereof. A gate electrode of the second amplifying transistor AX2 may be coupled to the second charge storage node FD2, a drain of the second amplifying transistor AX2 may be coupled to the power voltage $V_{DD}$, and a source of the second amplifying transistor AX2 may be coupled to a drain of the second selection transistor SX2.

The second sub-pixel SP2 to be sensed in the unit of row may be selected by the second selection transistor SX2. A selection gate electrode of the second selection transistor SX2 may be coupled to a second selection line SG2 to which a second selection signal is provided. When the second selection transistor SX2 is turned on by the second selection signal, the third pixel signal provided from the source of the second amplifying transistor AX2 may be outputted to the second output line $V_{OUT2}$ through the second selection transistor SX2.

According to the example embodiments illustrated in FIG. 5B, a unit pixel may include first and second sub-pixels SP1 and SP2, similarly to the example embodiments illustrated in FIG. 5A. In some example embodiments, the first and second sub-pixels SP1 and SP2 may share one "common" selection transistor SX. In other words, the selection transistor SX may be coupled in common to drains of first and second amplifying transistors AX1 and AX2 of the first and second sub-pixels SP1 and SP2. Thus, the first readout circuit RC1 and the second readout circuit RC2 may share a common selection transistor SX.

The first or second pixel signal may be outputted from the first sub-pixel SP1 to the first output line $V_{OUT1}$ through the source of the first amplifying transistor AX1. The third pixel signal may be outputted from the second sub-pixel SP2 to the second output line $V_{OUT2}$ through the source of the second amplifying transistor AX2.

Figure 6:
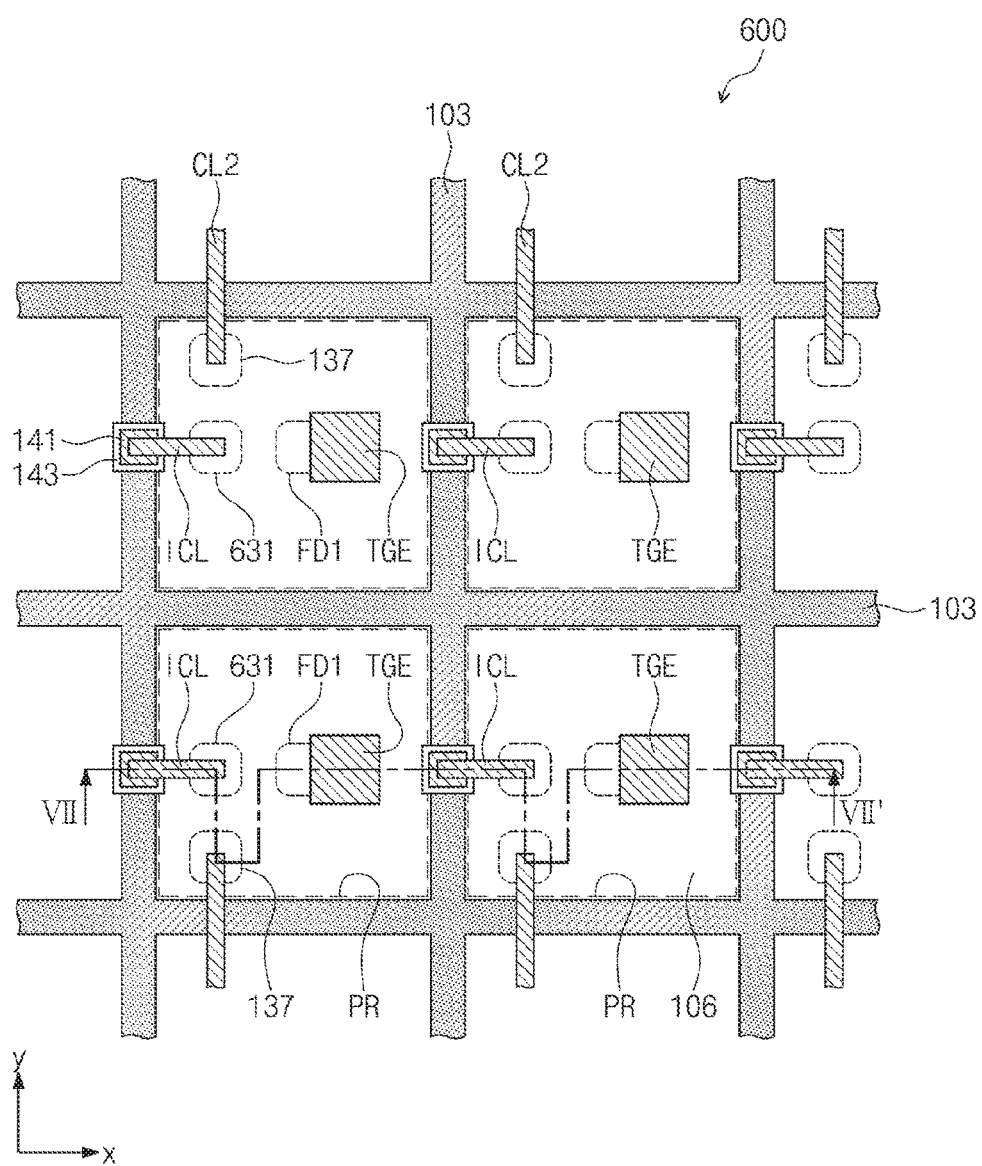
FIG. 6 is a plan view illustrating an image sensor according to some example embodiments of the inventive concepts.
Figure 7:
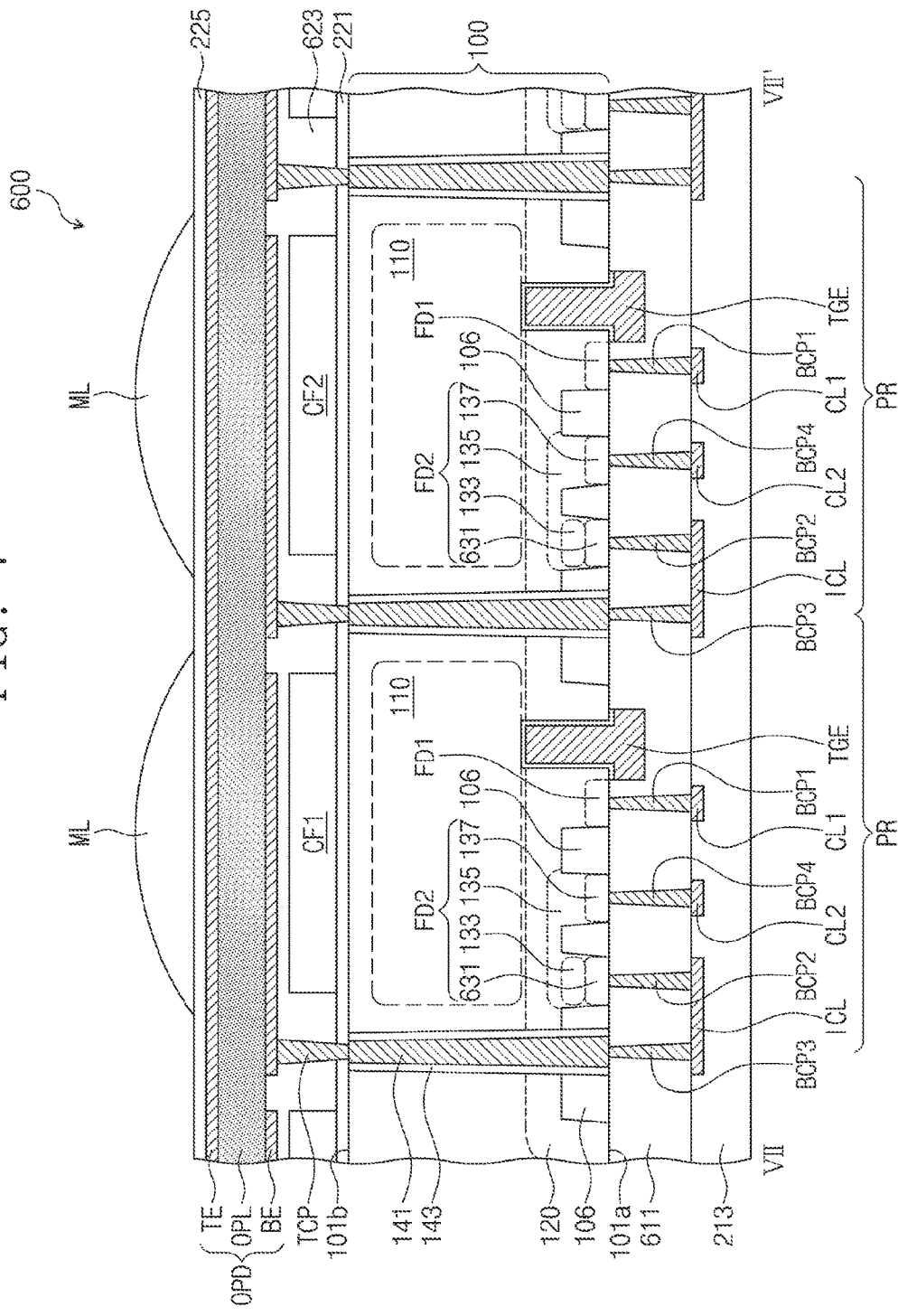
FIG. 7 is a cross-sectional view taken along a line VII-VII' of FIG. 6 to illustrate an image sensor according to some example embodiments of the inventive concepts.

FIG. 6 is a plan view illustrating an image sensor 600 according to some example embodiments of the inventive concepts. FIG. 7 is a cross-sectional view of the image sensor 600 taken along a line VI-VI' of FIG. 6 to illustrate an image sensor according to some example embodiments of the inventive concepts.

Referring to FIGS. 6 and 7, the image sensor 600 may include a semiconductor substrate 100 having ("associated with") a first conductivity type (e.g., a P-type). The semiconductor substrate 100 may include a plurality of pixel regions PR. The pixel regions PR may be arranged in a matrix form along an x-axis direction and a y-axis direction when viewed in a plan view. Each separate pixel region PR may at least partially comprise a separate unit pixel Px as described herein.

In some example embodiments, the semiconductor substrate 100 having the first conductivity type may include a silicon epitaxial layer doped with P-type dopants. The semiconductor substrate 100 may have a first surface 101a (also referred to herein as a "front surface") and a second surface 101b (also referred to herein as a "back surface"), which are opposite to each other.

In some example embodiments, first and second photoelectric conversion elements PD1 and PD2 (see FIG. 4) may be formed in the semiconductor substrate 100, and first and second readout circuits RC1 and RC2 may include MOS transistors integrated on the first surface 101a of the semiconductor substrate 100. An organic photoelectric conversion element OPD may be provided on a first upper insulating layer 623 provided on the second surface 101b of the semiconductor substrate 100, such that the first upper insulating layer 623 is an insulating layer between the organic photoelectric conversion element OPD and a surface of the semiconductor substrate 100. The first upper insulating layer 623 shown in FIG. 7 may correspond to the upper insulating layer 223 illustrated and described with reference to FIGS. 2A-2B. In other words, the organic photoelectric conversion element OPD may be stacked on the first and second photoelectric conversion elements PD1 and PD2 (see FIG. 4). In some example embodiments, the first and second photoelectric conversion elements PD1 and PD2 (see FIG. 4) may be photodiodes formed in the semiconductor substrate 100, and the organic photoelectric conversion element OPD may include top and bottom electrodes TE and BE and an organic photoelectric conversion layer OPL disposed between the top and bottom electrodes TE and BE.

In more detail, a first device isolation layer 103 may be formed in the semiconductor substrate 100 to define the pixel regions PR. The first device isolation layer 103 may vertically extend from the first surface 101a to the second surface 101b of the semiconductor substrate 100. The first device isolation layer 103 may include first portions extending in the x-axis direction and second portions extending in the y-axis direction.

The first device isolation layer 103 may be formed of (e.g., may at least partially comprise) an insulating material of which a refractive index is lower than that of the semiconductor substrate 100 (e.g., silicon). For example, the first device isolation layer 103 may be formed of (e.g., may at least partially comprise) a silicon oxide layer, a silicon nitride layer, an undoped poly-silicon layer, air, or any combination thereof. In some example embodiments, the first surface 101a and/or the second surface 101b of the semiconductor substrate 100 may be patterned to form a deep trench, and then, the first device isolation layer 103 may be formed by filling the deep trench with an insulating material.

A photoelectric conversion region 110 and a well dopant layer 120 may be provided in the semiconductor substrate 100 of each of the pixel regions PR.

The photoelectric conversion region 110 may generate photocharges in proportion to the intensity of incident light. The photoelectric conversion region 110 may be formed by ion-implanting dopants of a second conductivity type into the semiconductor substrate 100. The second conductivity type may be opposite to the first conductivity type of the semiconductor substrate 100. The photodiode may be formed by a PN junction of the semiconductor substrate 100 having the first conductivity type and the photoelectric conversion region 110 having the second conductivity type. In other words, the photoelectric conversion region 110 of each of the pixel regions PR may be included in the first or second photoelectric conversion element PD1 or PD2. According to some example embodiments, the photoelectric conversion region 110 may include a first region adjacent to the first surface 101a of the semiconductor substrate 100 and a second region adjacent to the second surface 101b of the semiconductor substrate 100. A dopant concentration of the first region of the photoelectric conversion region 110 may be different from that of the second region of the photoelectric conversion region 110, such that the photoelectric conversion region 110 may have a potential gradient between the first surface 101a and the second surface 101b of the semiconductor substrate 100. For example, the photoelectric conversion region 110 may include a plurality of stacked dopant regions having different dopant concentrations. As shown in at least FIG. 7, the photoelectric conversion region 110 may overlap with the organic photoelectric conversion element OPD in a direction that is perpendicular to a top surface (second surface 101b) of the semiconductor substrate 100.

The well dopant layer 120 may be disposed between the photoelectric conversion region 110 and the first surface 101a of the semiconductor substrate 100 and may be doped with dopants of which a conductivity type is opposite to that of the photoelectric conversion region 110. The well dopant layer 120 may be adjacent to the first surface 101a of the semiconductor substrate 100. In some example embodiments, the photoelectric conversion region 110 may be doped with N-type dopants, and the well dopant layer 120 may be doped with P-type dopants.

A second device isolation layer 106 may be formed in the well dopant layer 120 of each of the pixel regions PR to define active portions. The active portions may be spaced apart from (isolated from direct contact with) each other in each of the pixel regions PR and may have different sizes.

A second device isolation layer 106 may be formed in the well dopant layer 120. The second device isolation layer 106 shown in FIG. 7 may correspond to the device isolation layer 105 illustrated and described with reference to FIGS. 2A-2B. A vertical depth of the second device isolation layer 106 from the first surface 101a of the semiconductor substrate 100 may be smaller than a vertical depth of the first device isolation layer 103 from the first surface 101a of the semiconductor substrate 100. A bottom surface of the second device isolation layer 106 may be disposed in the well dopant layer 120. In some example embodiments, the first surface 101a of the semiconductor substrate 100 may be patterned to form a shallow trench, and then, the second device isolation layer 106 may be formed by filling the shallow trench with an insulating material. In some example embodiments, the second device isolation layer 106 may be a dopant region having the same conductivity type as the well dopant layer 120. In some example embodiments, a dopant concentration in the second device isolation layer 106 may be higher than that of the well dopant layer 120.

In each of the pixel regions PR, a transfer gate electrode TGE may be disposed on the first surface 101a of the semiconductor substrate 100, and a first floating diffusion region FD1 may be provided in the well dopant layer 120 at a side of the transfer gate electrode TGE. The first floating diffusion region FD1 may correspond to the first charge storage node FD1 of FIG. 5A or 5B.

The transfer gate electrode TGE may be disposed in a central portion of each of the pixel regions PR when viewed in a plan view. The transfer gate electrode TGE may include a lower portion inserted in the well dopant layer 120 and an upper portion protruding from the first surface 101a of the semiconductor substrate 100. The upper portion of the transfer gate electrode TGE may be coupled to the lower portion of the transfer gate electrode TGE. The transfer gate electrode TGE may penetrate the well dopant layer 120. A gate insulating layer may be disposed between the transfer gate electrode TGE and the semiconductor substrate 100. In some example embodiments, a trench may be formed in a portion of the well dopant layer 120, and a gate insulating layer and a gate conductive layer may be sequentially formed on the first surface 101a and in the trench. Thereafter, the gate conductive layer may be patterned to form the transfer gate electrode TGE.

In addition, the first and second readout circuits RC1 and RC2 described with reference to FIG. 5A or 5B may be provided together with the transfer gate electrode TGE on the first surface 101a of the semiconductor substrate 100.

The transfer gate electrode TGE may at least partially comprise (and in at least FIG. 7 represent) a transfer transistor that is on the semiconductor substrate 100 and is configured to transfer charges generated in the photoelectric conversion region 110 to the first charge storage node FD1.

The first floating diffusion region FD1 may be formed by ion-implanting dopants of which a conductivity type is opposite to that of the well dopant layer 120. For example, the first floating diffusion region FD1 may be an N-type dopant region.

In some example embodiments, a second floating diffusion region 631 and a pickup dopant region 137 may be provided in the well dopant layer 120 and may be spaced apart from (isolated from direct contact with) each other. In addition, the second floating diffusion region 631 and the pickup dopant region 137 may be spaced apart from (isolated from direct contact with) the first floating diffusion region FD1 by the second device isolation layer 106. The second floating diffusion region 631 shown in FIG. 7 may correspond to the floating diffusion region 131 illustrated and described with reference to FIGS. 2A-2B.

The second floating diffusion region 631 and the pickup dopant region 137 may have the same conductivity type as the first floating diffusion region FD1. In other words, the second floating diffusion region 631 and the pickup dopant region 137 may include dopants of the second conductivity type. In some example embodiments, the first and second floating diffusion regions FD1 and 131 and the pickup dopant region 137 may be formed at the same time.

A barrier dopant region 133 may be provided in the well dopant layer 120 and may be in contact with the second floating diffusion region 631. In some example embodiments, the barrier dopant region 133 may be spaced apart from (isolated from direct contact with) the pickup dopant region 137. In some example embodiments, the barrier dopant region 133 may be in contact with the second floating diffusion region 631 and the pickup dopant region 137. The barrier dopant region 133 may include dopants of the first conductivity type opposite to the second conductivity type of the second floating diffusion region 631. A concentration of the first conductivity type dopants in the barrier dopant region 133 may be less than a concentration of the second conductivity type dopants in the second floating diffusion region 631.

A charge drain region 135 may be provided in the well dopant layer 120 and may be in contact with the barrier dopant region 133 and the pickup dopant region 137. The charge drain region 135 may include dopants of the second conductivity type. A concentration of the second conductivity type dopants of the charge drain region 135 may be less than the concentration of the second conductivity type dopants of the second floating diffusion region 631. The second floating diffusion region 631, the barrier dopant region 133, the charge drain region 135, and the pickup dopant region 137 may constitute a second charge storage node FD2. In some example embodiments, the second charge storage node FD2 may be referred to as a first charge storage node, and the first charge storage node FD1 may be referred to as a second charge storage node. In some example embodiments, the floating diffusion region 631 may be referred to a first dopant region associated with a second conductivity type, the charge drain region 135 may be referred to as a second dopant region associated with a second conductivity type, and the barrier dopant region 133 may be referred to as a third dopant region associated with the first conductivity type, where the third dopant region is between the first dopant region and the second dopant region.

Through-electrodes 141 may be provided ("located") in the semiconductor substrate 100. The through-electrodes 141 may include a conductive material. The through-electrodes 141 may include at least one of poly-silicon doped with N-type or P-type dopants or a metal material. The through-electrodes 141 may be disposed between the pixel regions PR in a plan view and may penetrate the first device isolation layer 103. A width of each of the through-electrodes 141 may become progressively less toward the second surface 101b of the semiconductor substrate 100. In some example embodiments, a through-electrode 141, the third bottom contact plug BCP3, the second bottom contact plug BCP2, and the interconnection line ICL may at least partially comprise a first interconnection structure that is configured to couple the organic photoelectric conversion element OPD to a first dopant region (e.g., floating diffusion region 631) of the first charge storage node (e.g., the second charge storage node FD2).

A through insulating pattern 143 may be provided in the semiconductor substrate 100 to surround each of the through-electrodes 141. For example, the through insulating pattern 143 may include at least one of silicon oxide, silicon nitride, or silicon oxynitride.

A first lower insulating layer 611 may be disposed on the first surface 101a of the semiconductor substrate 100 and may cover the MOS transistors and the transfer gate electrodes TGE of the first and second readout circuits RC1 and RC2. The first lower insulating layer 611 shown in FIG. 7 may correspond to the lower insulating layer 211 illustrated and described with reference to FIGS. 2A-2B.

A plurality of bottom contact plugs BCP1 to BCP4 may be provided in the first lower insulating layer 611. In some example embodiments, a first bottom contact plug BCP1 may be coupled to the first floating diffusion region FD1, and a second bottom contact plug BCP2 may be coupled to the second floating diffusion region 631. A third bottom contact plug BCP3 may be coupled to the through-electrode 141, and a fourth bottom contact plug BCP4 may be coupled to the pickup dopant region 137.

The first bottom contact plug BCP1 may be electrically coupled to the first reset transistor RX1 (see FIGS. 5A and 5B) and the first amplifying transistor AX1 (see FIGS. 5A and 5B) through a first connection line CL1. Thus, a first amplifying transistor, the first amplifying transistor AX1 may include a first amplifying gate electrode that is coupled to the first dopant region (floating diffusion region 631) of the first charge storage node (the second charge storage node FD2) in FIG. 7 (e.g., via the interconnection line ICL and the second bottom contact plug BCP2). Furthermore, the second amplifying transistor AX2 as shown in FIGS. 5A-5B may include a second amplifying gate electrode that is coupled to a second charge storage node (the first charge storage node FD1) in FIG. 7 (e.g., via connection line CL1 and the first bottom contact plug BCP1).

The second bottom contact plug BCP2 may be electrically coupled to the third bottom contact plug BCP3 through an interconnection line ICL. In other words, the through-electrode 141 may be electrically coupled to the second floating diffusion region 631 through the second and third bottom contact plugs BCP2 and BCP3 and the interconnection line ICL.

The fourth bottom contact plug BCP4 may be electrically coupled to the bias circuit 10 of FIGS. 5A and 5B through a second connection line CL2. In other words, the bias voltage of the bias circuit 10 may be applied to the pickup dopant region 137. Here, the bias voltage may be the ground voltage or the negative voltage when the charges stored in the second floating diffusion region 631 are holes, as described with reference to FIGS. 1A and 3A. In some example embodiments, the bias voltage may be the power voltage or the positive voltage when the charges stored in the second floating diffusion region 631 are electrons, as described with reference to FIGS. 1B and 3B. In some example embodiments, the fourth bottom contact plug BCP4 and the second connection line CL2 may collectively comprise a second interconnection structure coupled to the second dopant region (pickup dopant region 137) of the first charge storage node (the second charge storage node FD2), the second interconnection structure configured to provide a bias voltage to the second dopant region.

A second lower insulating layer 213 may be disposed on the first surface 101a of the semiconductor substrate 100 with the first lower insulating layer 611 interposed therebetween. The second lower insulating layer 213 may cover the first and second connection lines CL1 and CL2 and the interconnection line ICL. For example, each of the first and second lower insulating layers 611 and 213 may include at least one of silicon oxide, silicon nitride, or silicon oxynitride.

A buffer insulating layer 221 may be disposed on the second surface 101b of the semiconductor substrate 100. The buffer insulating layer 221 may prevent charges (e.g., electrons or holes), which are generated by defects existing on the second surface 101b of the semiconductor substrate 100, from moving into the photoelectric conversion regions 110. The buffer insulating layer 221 may include a metal oxide such as aluminum oxide and/or hafnium oxide.

Color filters CF1 and CF2 may be disposed on the buffer insulating layer 221 to correspond to the pixel regions PR, respectively. The color filters CF1 and CF2 may include first color filters CF1 and second color filters CF2. The first color filters CF1 may correspond to the first color filters CF1 described with reference to FIG. 4, and the second color filters CF2 may correspond to the second color filters CF2 described with reference to FIG. 4.

The first upper insulating layer 623 may be disposed on the buffer insulating layer 221 and may cover the first and second color filters CF1 and CF2.

Top contact plugs TCP may penetrate the first upper insulating layer 623 and the buffer insulating layer 221 so as to be coupled to the through-electrodes 141, respectively. Each of the top contact plugs TCP may include a barrier metal layer and a metal layer. For example, the barrier metal layer may be formed of (e.g., may at least partially comprise) a metal nitride such as titanium nitride, tantalum nitride, tungsten nitride, hafnium nitride, and/or zirconium nitride. The metal layer may be formed of (e.g., may at least partially comprise) at least one of tungsten, copper, hafnium, zirconium, titanium, tantalum, aluminum, ruthenium, palladium, platinum, cobalt, nickel, or any conductive metal nitride thereof.

The bottom electrodes BE may be disposed on the first upper insulating layer 623. The bottom electrodes BE may respectively correspond to the pixel regions PR in a plan view and may be spaced apart from (isolated from direct contact with) each other. Each of the bottom electrodes BE may be electrically coupled to the second floating diffusion region 631 of each of the pixel regions PR through the top contact plug TCP, the through-electrode 141, the second and third bottom contact plugs BCP2 and BCP3, and the interconnection line ICL.

The bottom electrodes BE may include a transparent conductive material. For example, the bottom electrodes BE may include at least one of indium tin oxide (ITO), indium zinc oxide (IZO), zinc oxide (ZnO), $SnO_2$, antimony-doped tin oxide (ATO), aluminum-doped zinc oxide (AZO), gallium-doped zinc oxide (GZO), $TiO_2$, or fluorine-doped tin oxide (FTO).

The organic photoelectric conversion layer OPL may be disposed on the bottom electrodes BE. The organic photoelectric conversion layer OPL may selectively absorb light of a specific wavelength band and may convert the absorbed light into an electrical signal. The organic photoelectric conversion layer OPL may include a P-type organic semiconductor material and an N-type organic semiconductor material, which form a PN junction. In some example embodiments, the organic photoelectric conversion layer OPL may include quantum dots or a chalcogenide.

The top electrode TE may be provided on the organic photoelectric conversion layer OPL. The top electrode TE may include the transparent conductive material and may cover all of the pixel regions PR.

A second upper insulating layer 225 may be disposed on the top electrode TE, and micro lenses ML may be disposed on the second upper insulating layer 225. The micro lenses ML may be disposed to correspond to the pixel regions PR, respectively. The micro lenses ML may have convex shapes to concentrate light.

Figure 8:
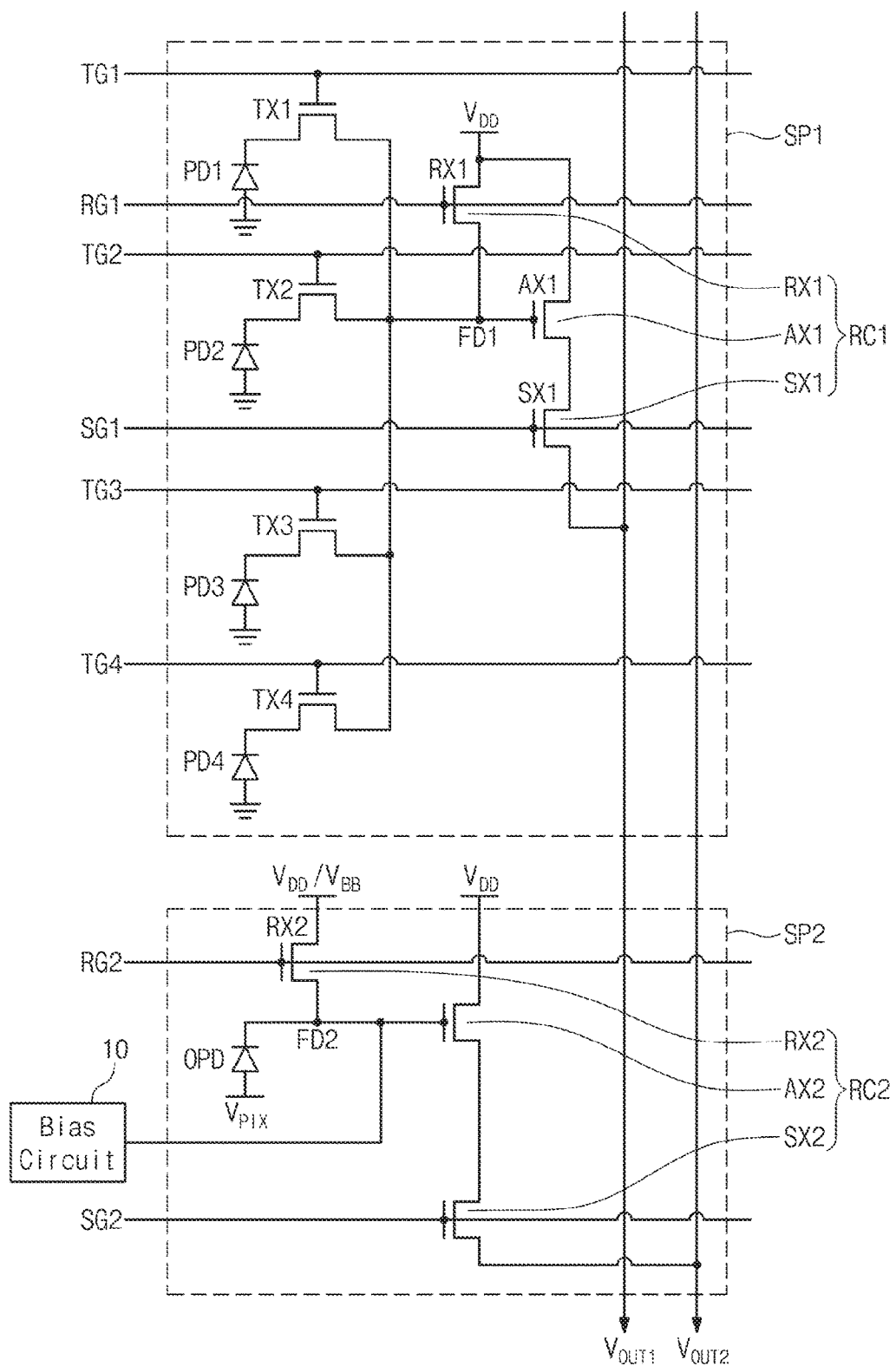
FIG. 8 is a circuit diagram illustrating an image sensor according to some example embodiments of the inventive concepts.

FIG. 8 is a circuit diagram illustrating an image sensor according to some example embodiments of the inventive concepts. Hereinafter, the same elements as described in the embodiments of FIGS. 5A and 5B will be indicated by the same reference numerals or the same reference designators, and the descriptions thereto will be omitted or mentioned briefly for the purpose of ease and convenience in explanation.

Referring to FIG. 8, a unit pixel of an image sensor may include first and second sub-pixels SP1 and SP2. In some example embodiments, the first sub-pixel SP1 may include first to fourth photoelectric conversion elements PD1, PD2, PD3, and PD4, first to fourth transfer transistors TX1, TX2, TX3, and TX4, and a first readout circuit RC1.

The first to fourth photoelectric conversion elements PD1, PD2, PD3, and PD4 may be substantially the same (e.g., the same within manufacturing tolerances and/or material tolerances) as the first and second photoelectric conversion elements PD1 and PD2 described above.

The first to fourth transfer transistors TX1, TX2, TX3, and TX4 may be coupled in common to a first charge storage node FD1. The first to fourth transfer transistors TX1, TX2, TX3, and TX4 may be controlled by charge transfer signals provided through first to fourth charge transfer lines TG1, TG2, TG3, and TG4. Depending on the charge transfer signals applied to the first to fourth transfer transistors TX1 to TX4, charges may be transferred from one of the first to fourth photoelectric conversion elements PD1 to PD4 to the first charge storage node FD1.

In the example embodiments illustrated in FIG. 8, the second sub-pixel SP2 may include the organic photoelectric conversion element OPD and the second readout circuit RC2, as described with reference to FIG. 5A.

Figure 9:
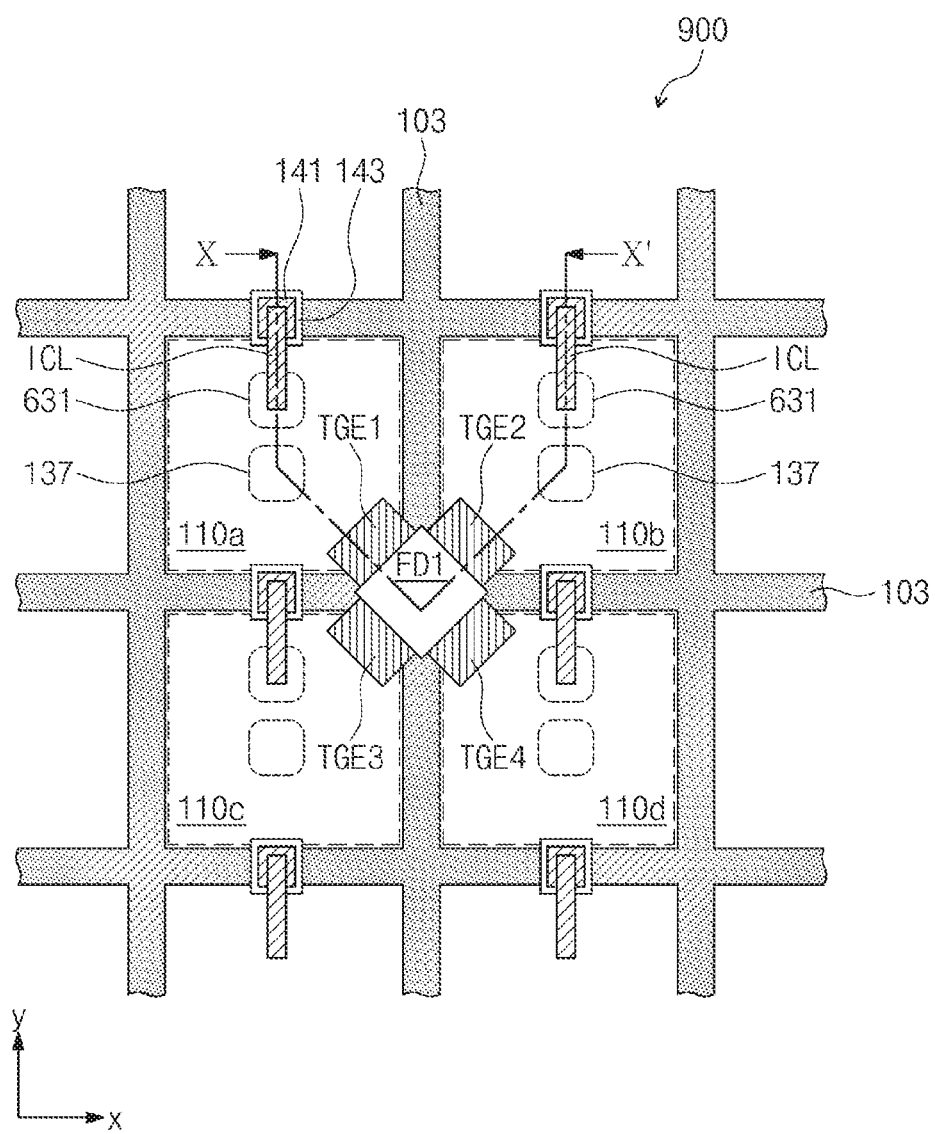
FIG. 9 is a plan view illustrating an image sensor according to some example embodiments of the inventive concepts.
Figure 10:
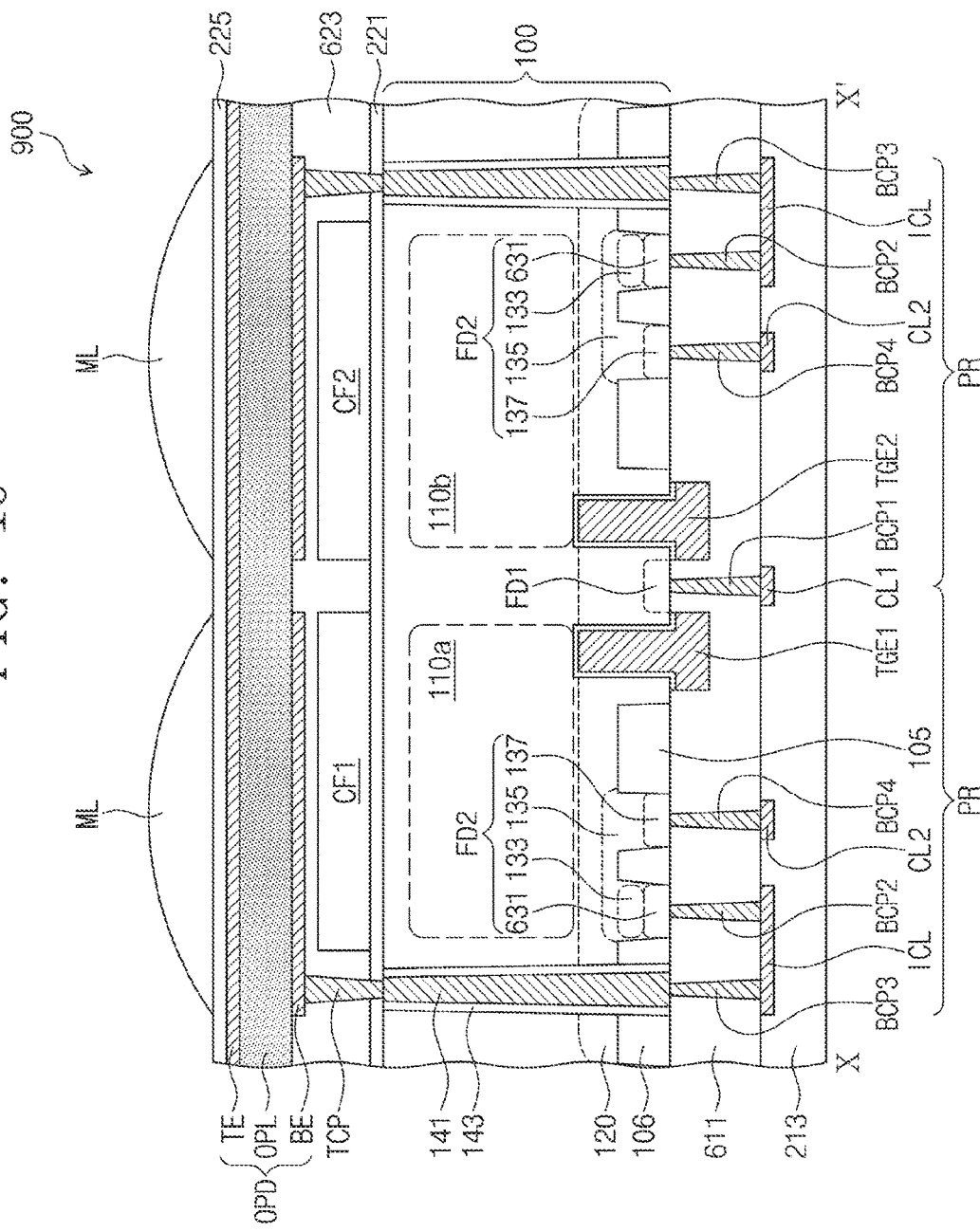
FIG. 10 is a cross-sectional view taken along a line X-X' of FIG. 9 to illustrate an image sensor according to some example embodiments of the inventive concepts.

FIG. 9 is a plan view illustrating an image sensor 900 according to some example embodiments of the inventive concepts. FIG. 10 is a cross-sectional view of the image sensor 900 taken along a line X-X' of FIG. 9 to illustrate an image sensor according to some example embodiments of the inventive concepts.

Hereinafter, the same elements as described in the embodiments of FIGS. 6 and 7 will be indicated by the same reference numerals or the same reference designators, and the descriptions thereto will be omitted or mentioned briefly for the purpose of ease and convenience in explanation.

Referring to FIGS. 9 and 10, first to fourth photoelectric conversion regions 110a, 110b, 110c, and 110d may be formed in the semiconductor substrate 100. The first to fourth photoelectric conversion regions 110a to 110d may be arranged in a matrix form along an x-axis direction and a y-axis direction when viewed in a plan view.

The first to fourth photoelectric conversion regions 110a to 110d may be formed by ion-implanting dopants of the second conductivity type (e.g., an N-type) into the semiconductor substrate 100. Photodiodes may be formed by PN junctions of the semiconductor substrate 100 having the first conductivity type and the first to fourth photoelectric conversion regions 110a to 110d having the second conductivity type.

The first to fourth photoelectric conversion regions 110a to 110d may be isolated from each other by the first device isolation layer 103. The first device isolation layer 103 may surround each of the first to fourth photoelectric conversion regions 110a to 110d when viewed in a plan view. In other words, the first device isolation layer 103 may be formed between the first and second photoelectric conversion regions 110a and 110b adjacent to each other in the x-axis direction, between the third and fourth photoelectric conversion regions 110c and 110d adjacent to each other in the x-axis direction, between the first and third photoelectric conversion regions 110a and 110c adjacent to each other in the y-axis direction, and between the second and fourth photoelectric conversion regions 110b and 110d adjacent to each other in the y-axis direction.

In some example embodiments, the first device isolation layer 103 may be a dopant region doped with dopants of which a conductivity type is opposite to that of the first to fourth photoelectric conversion regions 110a to 110d. In some example embodiments, the first device isolation layer 103 may provide a potential barrier between the first to fourth photoelectric conversion regions 110a to 110d.

A first floating diffusion region FD1 (i.e., the first charge storage node) may be provided between the first to fourth photoelectric conversion regions 110a to 110d in the well dopant layer 120. The first floating diffusion region FD1 may be formed by ion-implanting dopants of the second conductivity type (e.g., the N-type) into the semiconductor substrate 100.

First to fourth transfer gate electrodes TGE1, TGE2, TGE3, and TGE4 may be disposed on the first surface 101a of the semiconductor substrate 100. The first to fourth transfer gate electrodes TGE1 to TGE4 may be disposed between the first floating diffusion region FD1 and the first to fourth photoelectric conversion regions 110a to 110d, respectively, when viewed in a plan view. Gate insulating layers may be disposed between the semiconductor substrate 100 and the transfer gate electrodes TGE1 to TGE4, respectively.

As described above, each of the first to fourth transfer gate electrodes TGE1 to TGE4 may include a lower portion inserted in the well dopant layer 120 and an upper portion protruding from the first surface 101a of the semiconductor substrate 100.

The first lower insulating layer 611 may be disposed on the first surface 101a of the semiconductor substrate 100, and a first bottom contact plug BCP1 may penetrate the first lower insulating layer 611 so as to be coupled to the first floating diffusion region FD1.

As described above, the second bottom contact plug BCP2 may be coupled to the second floating diffusion region 631, and the third bottom contact plug BCP3 may be coupled to the through-electrode 141. The interconnection line ICL may couple the second and third bottom contact plugs BCP2 and BCP3 to each other.

In addition, as described above, the color filters CF1 and CF2 and the organic photoelectric conversion element OPD may be provided on the second surface 101b of the semiconductor substrate 100.

According to some example embodiments of the inventive concepts, it is possible to reduce or inhibit a blooming phenomenon or an image lag phenomenon which may be caused by photocharges overflowing or remaining in the charge storage node for storing the photocharges generated in the photoelectric conversion element. Thus, the image sensor according to some example embodiments of the inventive concepts may realize a clearer image.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor, comprising:
    a semiconductor substrate having a first surface and a second surface opposite to each other;
    a photoelectric conversion element configured to generate photocharges and disposed on the first surface of the semiconductor substrate; and
    a charge storage node configured to be coupled to the photoelectric conversion element and being adjacent to the second surface of the semiconductor substrate, the charge storage node configured to store photocharges generated in the photoelectric conversion element, the charge storage node including
        a floating diffusion region in the semiconductor substrate, the semiconductor substrate associated with a first conductivity type, the floating diffusion region associated with a second conductivity type;
        a barrier dopant region on the floating diffusion region in the semiconductor substrate, the barrier dopant region associated with the first conductivity type, and
        a charge drain region on the barrier dopant region in the semiconductor substrate, the charge drain region associated with the second conductivity type,
    wherein the floating diffusion region, the barrier dopant region, and the charge drain region are spaced apart from the first surface.

2. The image sensor of claim 1, wherein,
    the charge storage node further includes a pickup dopant region in the charge drain region,
    the pickup dopant region is isolated from direct contact with the floating diffusion region and the barrier dopant region, and
    the pickup dopant region is associated with the second conductivity type.

3. The image sensor of claim 2, further comprising:
    a connection line coupled to the pickup dopant region, the connection line configured to provide a bias voltage to the pickup dopant region.

4. The image sensor of claim 1, wherein a concentration of dopants associated with the first conductivity type in the barrier dopant region is less than a concentration of dopants associated with the second conductivity type in the floating diffusion region.

5. The image sensor of claim 1, wherein a concentration of dopants associated with the second conductivity type in the charge drain region is less than a concentration of dopants associated with the second conductivity type in the floating diffusion region.

6. The image sensor of claim 1, further comprising:
    a reset transistor electrically coupled to the floating diffusion region.

7. The image sensor of claim 1, further comprising:
    an amplifying transistor including an amplifying gate electrode, the amplifying gate electrode electrically coupled to the floating diffusion region.

8. The image sensor of claim 1, further comprising:
    an interconnection structure configured to couple the photoelectric conversion element to the charge storage node,
    wherein the interconnection structure includes
        a through-electrode penetrating the semiconductor substrate such that the through-electrode is coupled to a terminal of the photoelectric conversion element,
        a lower insulating layer on the second surface of the semiconductor substrate,
        a first bottom contact plug penetrating the lower insulating layer such that the first bottom contact plug is coupled to the floating diffusion region,
        a second bottom contact plug penetrating the lower insulating layer such that the second bottom contact plug is coupled to the through-electrode, and
        an interconnection line coupling the first bottom contact plug to the second bottom contact plug.

9. The image sensor of claim 1, wherein the photoelectric conversion element includes a bottom electrode, a top electrode, and an organic photoelectric conversion layer, the organic photoelectric conversion layer between the bottom electrode and the top electrode.

10. An image sensor, comprising:
    a floating diffusion region in a semiconductor substrate, the semiconductor substrate associated with a first conductivity type, the floating diffusion region associated with a second conductivity type;
    a charge drain region in the semiconductor substrate, the charge drain region isolated from direct contact with the floating diffusion region, the charge drain region associated with the second conductivity type;
    a barrier dopant region between the floating diffusion region and the charge drain region in the semiconductor substrate, the barrier dopant region associated with the first conductivity type;
    a buffer insulating layer on the semiconductor substrate;
    an organic photoelectric conversion element on the buffer insulating layer, the organic photoelectric conversion element including a bottom electrode, a top electrode, and an organic photoelectric conversion layer, the organic photoelectric conversion layer between the bottom electrode and the top electrode; and
    a first interconnection structure configured to couple the floating diffusion region to the bottom electrode of the organic photoelectric conversion element,
    wherein a width of the charge drain region is greater than a width of the floating diffusion region.

11. The image sensor of claim 10, wherein a concentration of dopants associated with the first conductivity type in the barrier dopant region is less than a concentration of dopants associated with the second conductivity type in the floating diffusion region.

12. The image sensor of claim 10, further comprising:
    a pickup dopant region in the charge drain region, the pickup dopant region isolated from direct contact with the floating diffusion region and the barrier dopant region,
    wherein the pickup dopant region is associated with the second conductivity type.

13. The image sensor of claim 12, further comprising:
    a second interconnection structure configured to provide a bias voltage to the pickup dopant region.

14. The image sensor of claim 10, further comprising:
    a reset transistor electrically coupled to the floating diffusion region.

15. The image sensor of claim 10, further comprising:
    an amplifying transistor including an amplifying gate electrode, the amplifying gate electrode electrically coupled to the floating diffusion region.

16. The image sensor of claim 10, wherein the first interconnection structure includes a through-electrode penetrating the semiconductor substrate;
    a top contact plug configured to couple the through-electrode to the bottom electrode;
    a plurality of bottom contact plugs, the plurality of bottom contact plugs including a first bottom contact plug that is coupled to the floating diffusion region and a second bottom contact plug that is coupled to the through-electrode; and an interconnection line configured to couple the plurality of bottom contact plugs to each other.

17. The image sensor of claim 10, further comprising:

a photoelectric conversion region in the semiconductor substrate, the photoelectric conversion region including dopants associated with the second conductivity type, wherein the photoelectric conversion region overlaps with the organic photoelectric conversion element in a direction that is perpendicular to a top surface of the semiconductor substrate.

18. An image sensor comprising:

a semiconductor substrate associated with a first conductivity type;

an organic photoelectric conversion element on the semiconductor substrate;

a first charge storage node in the semiconductor substrate, the first charge storage node including
- a first dopant region associated with a second conductivity type,
- a second dopant region associated with the second conductivity type, and
- a third dopant region associated with the first conductivity type, the third dopant region between the first dopant region and the second dopant region;

a first interconnection structure configured to couple the organic photoelectric conversion element to the first dopant region of the first charge storage node;

a photoelectric conversion region in the semiconductor substrate, the photoelectric conversion region and associated with the second conductivity type;

a second charge storage node in the semiconductor substrate, the second charge storage node isolated from direct contact with the first charge storage node, the second charge storage node including dopants associated with the second conductivity type; and a transfer transistor on the semiconductor substrate, the transfer transistor configured to transfer charges generated in the photoelectric conversion region to the second charge storage node, wherein the photoelectric conversion region overlaps with the first to third dopant regions in a direction that is perpendicular to a top surface of the semiconductor substrate.

19. The image sensor of claim 18, wherein the organic photoelectric conversion element overlaps with the photoelectric conversion region in a direction that is perpendicular to the top surface of the semiconductor substrate.

20. The image sensor of claim 18, further comprising:

an insulating layer between the organic photoelectric conversion element and a surface of the semiconductor substrate; and a color filter between the organic photoelectric conversion element and the insulating layer.

* * * * *